(12) United States Patent
Shinohara

(10) Patent No.: US 10,109,626 B2
(45) Date of Patent: Oct. 23, 2018

(54) SEMICONDUCTOR DEVICE AND METHOD OF MANUFACTURING SAME

(71) Applicant: Renesas Electronics Corporation, Tokyo (JP)

(72) Inventor: Masaaki Shinohara, Tokyo (JP)

(73) Assignee: Renesas Electronics Corporation, Koutou-ku, Tokyo (JP)

(\*) Notice: Subject to any disclaimer, the term of this patent is extended or adjusted under 35 U.S.C. 154(b) by 0 days.

(21) Appl. No.: 15/455,497

(22) Filed: Mar. 10, 2017

(65) Prior Publication Data

US 2017/0301669 A1 Oct. 19, 2017

(30) Foreign Application Priority Data

Apr. 14, 2016 (JP) ................... 2016-080752

(51) Int. Cl.
*H01L 21/8234* (2006.01)
*H01L 27/088* (2006.01)
*H01L 29/06* (2006.01)

(52) U.S. Cl.
CPC .... *H01L 27/088* (2013.01); *H01L 21/823481* (2013.01); *H01L 29/0649* (2013.01)

(58) Field of Classification Search
CPC ..... H01L 21/823481; H01L 21/823878; H01L 29/0649; H01L 29/0653
USPC ........................................ 257/510; 438/422
See application file for complete search history.

(56) References Cited

U.S. PATENT DOCUMENTS

| 8,357,989 B2 | 1/2013 | Onishi et al. |
| 9,263,320 B2 * | 2/2016 | Murata ............ H01L 21/02216 |
| 2014/0291767 A1 | 10/2014 | Lee et al. |

FOREIGN PATENT DOCUMENTS

JP   2011-66067 A   3/2011

\* cited by examiner

*Primary Examiner* — Mark Prenty
(74) *Attorney, Agent, or Firm* — Sughrue Mion, PLLC

(57) ABSTRACT

To provide a semiconductor device having an element isolation structure formed in the main surface of a semiconductor substrate, having a space in a trench, and prevented from having deteriorated performance due to an increase in the height of the top portion of the space. A trench portion is formed in the main surface of a semiconductor substrate by using a hard-mask insulating film. A first insulating film that covers the upper surface of the hard-mask insulating film and the surface of the trench portion is formed, followed by etch-back of the first insulating film to expose the upper surface of the hard-mask insulating film. Then, second and third insulating films that cover the upper surface of the hard-mask insulating film and the surface of the trench portion are formed to form a space in the trench portion.

14 Claims, 10 Drawing Sheets

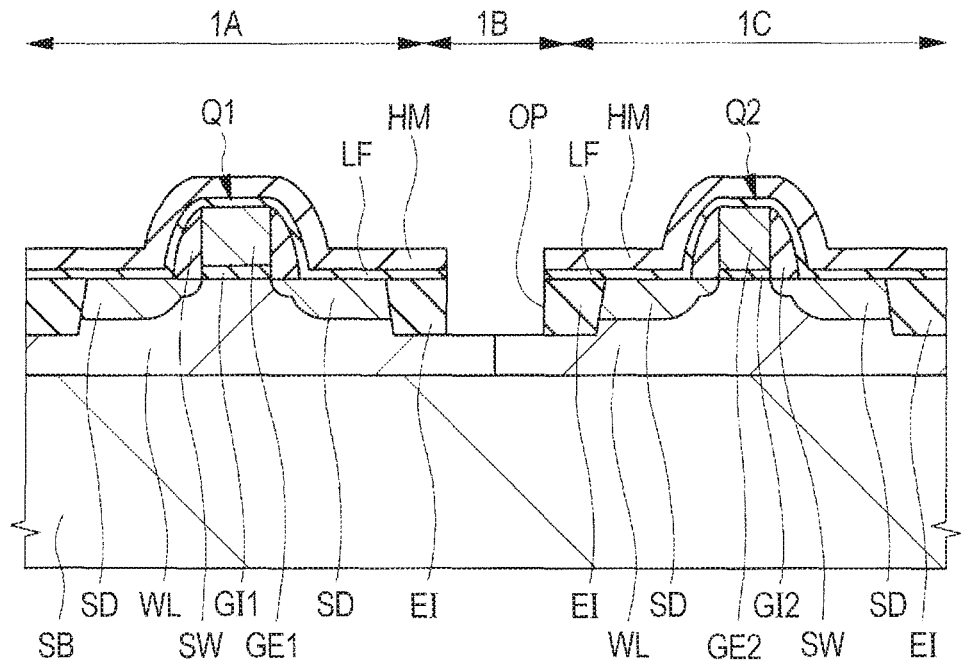
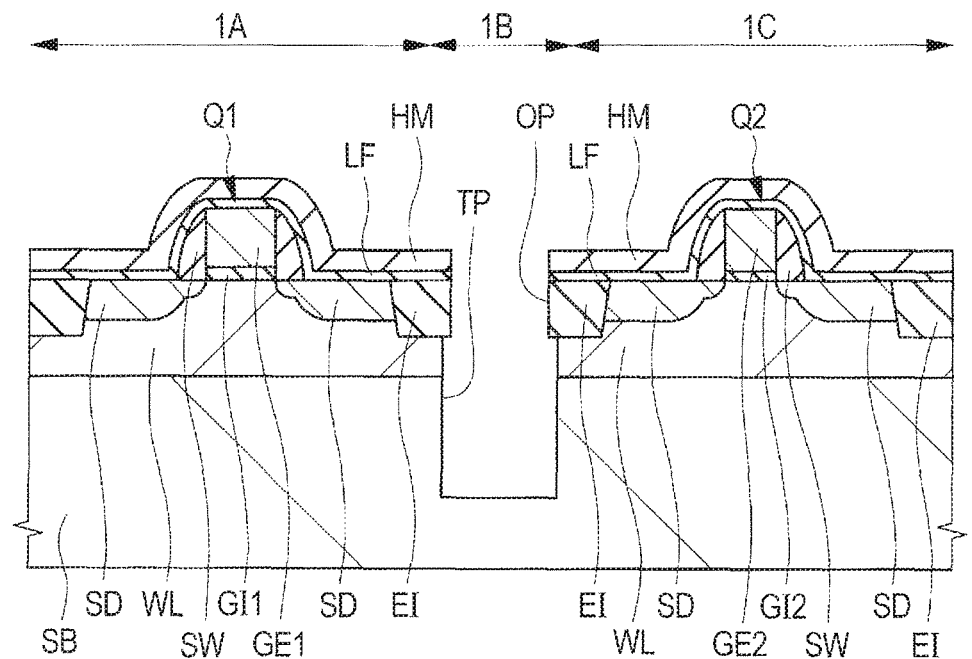

SEMICONDUCTOR DEVICE AND METHOD OF MANUFACTURING SAME

CROSS-REFERENCE TO RELATED APPLICATIONS

The disclosure of Japanese Patent Application No. 2016-080752 filed on Apr. 14, 2016 including the specification, drawings, and abstract is incorporated herein by reference in its entirety.

BACKGROUND

The present invention relates to a semiconductor device and a method of manufacturing same. For example, it is suited for use in a method of manufacturing a semiconductor device having a trench portion.

There is a semiconductor device having an element isolation structure obtained by forming an insulating film in a trench portion made in the surface, which is a main surface, of a semiconductor substrate. There is also a semiconductor device having an element isolation (deep trench isolation: DTI) structure obtained by forming an insulating film in a trench portion having as aspect ratio, that is, a ratio of the depth of the trench portion to the width of the trench portion, as high as more than 1.

Patent Document 1 (Japanese Unexamined Patent Application Publication No. 2011-66067) discloses a method of manufacturing a semiconductor device including a step of forming a trench that surrounds an element in plan view in the main surface of a semiconductor substrate and a step of forming an insulating film on the element and in the trench. According to Patent Document 1, the insulating film is formed so as to cover the upper surface of the element and to form a space in the trench.

Patent Document 2 (US Patent Application Publication No. 2014-0291767) describes that a space is formed in a trench formed In the main surface of a semiconductor substrate at the side of an element. In a manufacturing step of a semiconductor device described in Patent Document 2, the space is formed in the trench by forming an oxide film that covers the upper surface of the semiconductor substrate and the surface of the trench, removing the oxide film on the semiconductor substrate, and then forming, on the semiconductor substrate, an insulating film contiguous to the side wall of the oxide film in the trench.

[Patent Document 1] Japanese Unexamined Patent Application Publication No. 2011-66067
[Patent Document 2] US Patent Application Publication No. 2014-0291767

SUMMARY

When an insulating film is formed in a trench portion having a high aspect ratio, the trench portion is sometimes closed with a space left therein, for example, by forming an insulating film made of a silicon oxide film by chemical vapor deposition (CVD). In this case, the film thickness of the insulating film formed on the side surface of the upper portion of the trench portion is likely to be thicker than that of an insulating film formed on the side surface of the bottom portion of the trench portion. By forming an insulating film on the side surface of the trench portion, the trench portion can be closed while leaving a space in the trench portion. Element isolation properties achieved by insulating between elements by a DTI structure are improved when a trench portion has a space therein compared with when a trench portion has no space therein.

It is however difficult to form an insulating film made of a silicon oxide film by CVD while adjusting, with precision, a closed position at an upper end of a space left in the trench portion to a desired height position. There is a possibility of the closed position of the space left in the trench portion becoming higher than the desired position.

When the closed position of the space is higher than the desired position, the height position of the surface of an insulating film formed on the space is below the closed position of the space, for example, during polishing and planarizing the upper surface of the insulating film. Then, the space is exposed from the surface of the insulating film. In this case, there is a possibility of a polishing slurry entering the space or a washing liquid entering the space in a subsequent washing step. The slurry or washing liquid that has entered the space may blow from the space and become a cause of foreign matters. As a result, the semiconductor device may have a defective shape and have deteriorated performance.

Another object and novel features will be apparent from the description herein and accompanying drawings.

The outline of a representative embodiment disclosed herein will next be described briefly.

In one aspect, there is provided a method of manufacturing a semiconductor device including forming a trench for the formation of a DTI structure in the main surface of a semiconductor substrate while using a hard mask, covering the surface of the trench and the upper surface of the hard mask with a first insulating film, exposing the upper surface of the hard mask by etch-back, and forming a second insulating film to close an upper portion of the trench to form a space therein.

In another aspect, there is provided a semiconductor device equipped with a DTI structure having a trench formed in the main surface of a semiconductor substrate and a space in the trench. It has a hard mask covering the main surface of the semiconductor substrate, a first insulating film covering the side wall of the trench and exposes the upper surface of the hard mask, and a second insulating film covering the surface of the trench, the first insulating film, and the upper surface of the hard mask.

The embodiment makes it possible to provide a semiconductor device having improved performance.

BRIEF DESCRIPTION OF THE DRAWINGS

FIG. 5 is a cross-sectional view of the semiconductor device during a manufacturing step thereof following that of FIG. 4;

FIG. 6 is a cross-sectional view of the semiconductor device during a manufacturing step thereof following that of FIG. 5;

DETAILED DESCRIPTION

Figure 1:
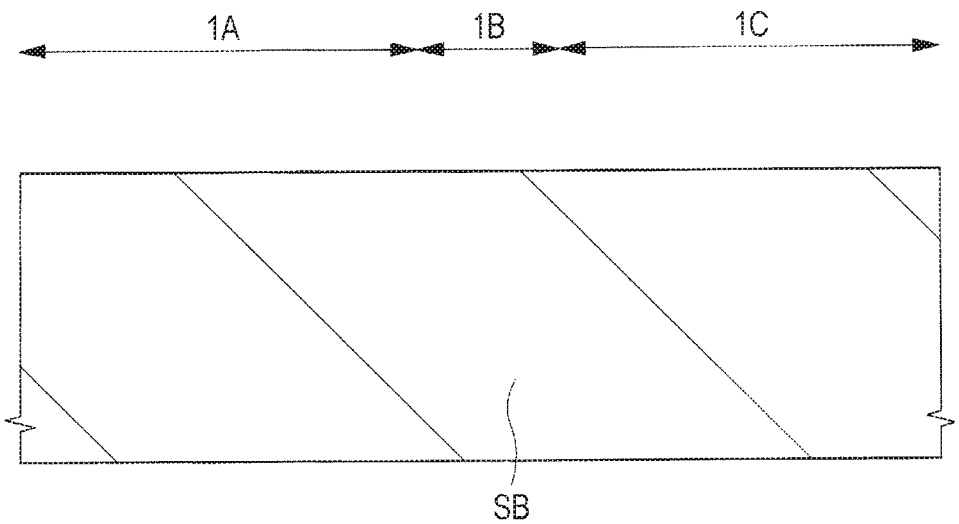
FIG. 1 is a cross-sectional view of a semiconductor device according to the embodiment of the invention during a manufacturing step thereof.

The embodiment will hereinafter be described in detail based on some drawings. In all the drawings for describing the embodiment, a member having a like function will be identified by a like reference numeral and overlapping description will be omitted. In the following embodiment, a description of the same or similar portion is not repeated in principle unless otherwise necessary.

<Method of Manufacturing Semiconductor Device>

Figure 7:
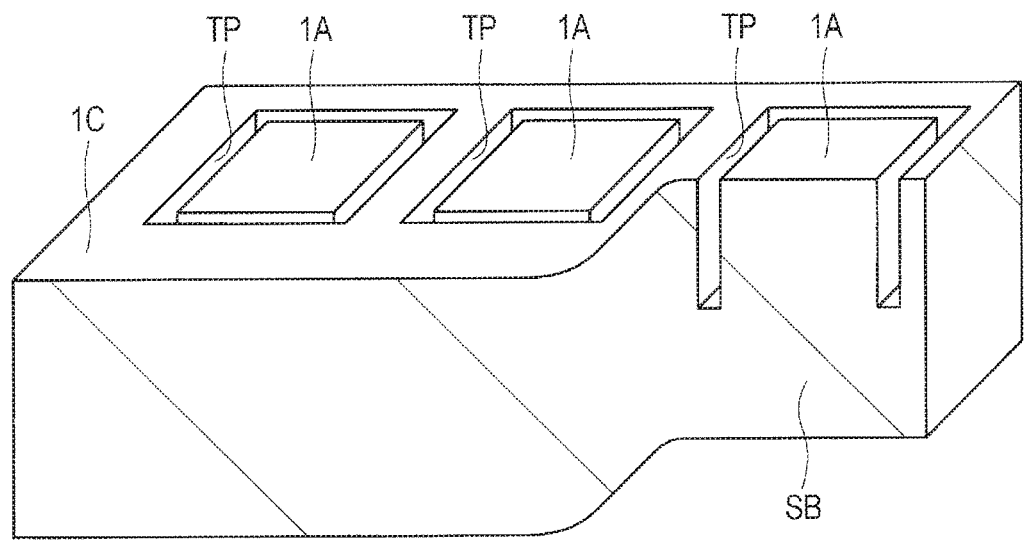
FIG. 7 is a partially cutaway perspective view showing the constitution of the semiconductor device shown in FIG. 6 during the manufacturing step thereof.

A method of manufacturing a semiconductor device according to the present embodiment will hereinafter be described referring to FIGS. 1 to 18. FIGS. 1 to 6. FIGS. 8 to 16, and FIG. 18 are cross-sectional views of the semiconductor device of the present embodiment during a manufacturing step thereof. FIG. 7 is a partially cutaway perspective view showing the constitution of the semiconductor device shown in FIG. 6 during the manufacturing step thereof. FIG. 17 is a plan view of the semiconductor device of the present embodiment during a manufacturing step thereof.

FIGS. 1 to 6. FIGS. 8 to 16, and FIG. 18 show element regions 1A and 1C which are formation regions of as n channel MISFET (metal insulator semiconductor field effect transistor) and also show an isolation region 1B which is located between the element regions 1A and 1C adjacent to each other and is a formation region of a DTI structure. It is to be noted that the DTI structure may be formed not only between elements of the same kind adjacent to each other but also in the main surface of a semiconductor substrate between different elements, for example, between a p channel MISFET and an n channel MISFET or between MISFET and a capacitance element.

The DTI structure is formed, for example, between an element such as high-breakdown-voltage MISFET or capacitance element and a low-breakdown voltage MISFET. The DTI structure is a structure used for electrically isolating elements from each other. In other words, the DTI structure is one of insulating element isolation regions (element isolation structures) and it has a depth greater than that of an element isolation region for isolating, for example, low-breakdown-voltage MISFETs from each other. The DTI structure of the present application has a trench formed in the main surface of a semiconductor substrate and an insulating film and a space in the trench.

The element region 1A is a region in which a semiconductor element having a breakdown voltage higher than that of an element to be formed in the element region 1C. Here, a step of forming a DTI structure between a high-breakdown-voltage MISFET and a low-break-down-voltage MISFET adjacent to each other. Since the present embodiment is mainly characterized in the DTI structure and a manufacturing process thereof, a manufacturing step of a semiconductor element to be formed before formation of the DTI structure is not described in detail.

First, as shown in FIG. 1, a semiconductor substrate SB is provided. The semiconductor substrate SB provided here is comprised of a low-resistance substrate made of, for example, a p type single-crystal silicon (Si) and having a resistivity (specific resistance) of, for example, from about 1 to 10 mΩ·cm. The semiconductor substrate SP has a main surface and a back surface which is on the side opposite to the main surface. The main surface of the semiconductor substrate SB has the element region 1A, the isolation region 1B, and the element region 1 arranged side by side.

In the present embodiment, a description is made on the formation of an MISFET in the vicinity of the main surface of the semiconductor substrate SB and formation of a DTI structure in a trench formed in the main surface. Alternatively, a p⁻ type epitaxial layer made of, for example, p type single crystal Si may be formed on the main surface of the semiconductor substrate SB by a known epitaxial growth method. Even when the epitaxial layer is formed, the semiconductor substrate SB and the epitaxial layer (semiconductor layer) thereon can be called "substrate" or "semiconductor substrate" collectively.

Figure 2:
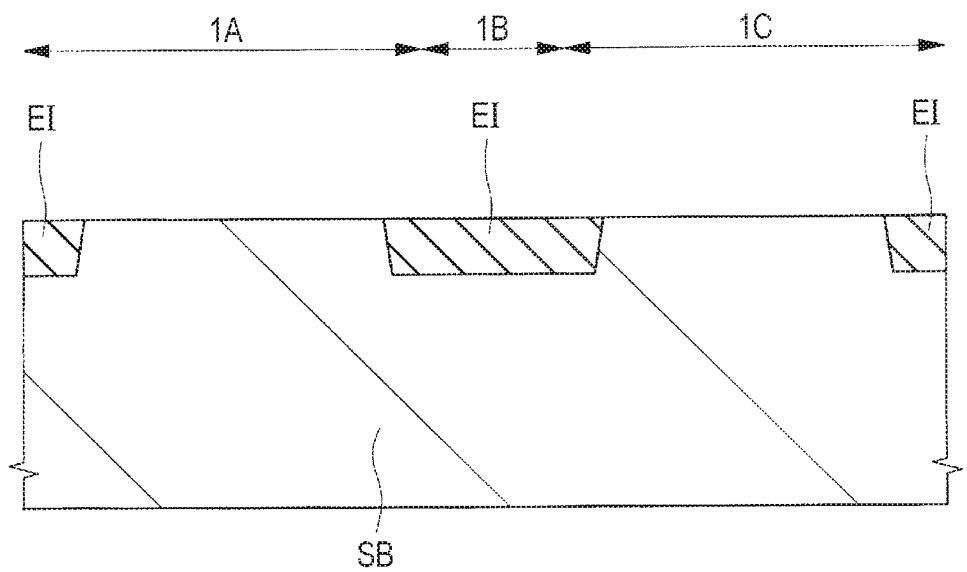
FIG. 2 is a cross-sectional view of the semiconductor device during a manufacturing step thereof following that of FIG. 1.

Next, as shown in FIG. 2, an element isolation region EI is formed on the semiconductor substrate SB in the element region 1A, the isolation region 1B, and the element region 1C. Here, an element isolation region EI as an insulating film is formed in the main surface of the semiconductor substrate SB, for example, by STI (shallow trench isolation) or LOCOS (local oxidization of silicon). Formation of the element isolation region EI using STI will next be described.

By dry etching with a photoresist film (not shown) as an etching mask, the semiconductor substrate SB is removed from a region in which the element isolation region EI is to be formed and thus, an element isolation trench is formed.

Next, an insulating film made of silicon oxide is deposited on the surface of the semiconductor substrate SB by CVD or the like to fill the element isolation trench with the insulating film. In other words, an insulating film made of a silicon oxide film is formed on the surface of the semiconductor substrate SB. As the silicon oxide film, a silicon oxide film superior flowability such as that obtained by CVD while using, as a material, a gas containing, for example, an ozone ($O_3$) gas and tetraethoxysilane (TEOS) can be used. The definition of the flowability will be described later.

Next, the insulating film is polished using CMP (chemical mechanical polishing) or the like to planarize the surface of the insulating film. As a result, the element isolation region EI as an insulating film buried in the element isolation region can be formed.

The element isolation region EI can also be formed, for example, by the LOCOS process using thermal oxidation treatment with a mask.

Figure 3:
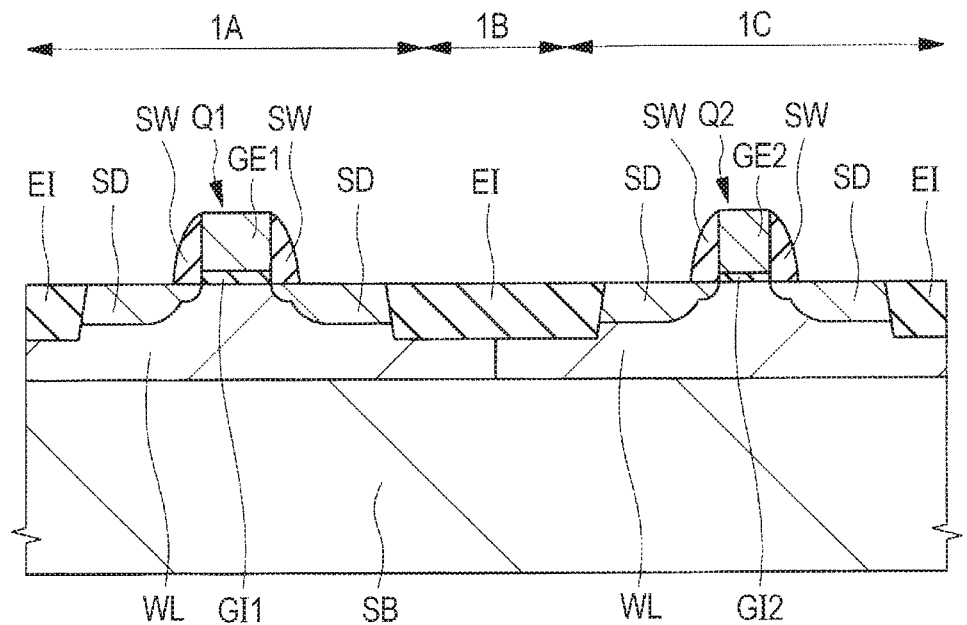
FIG. 3 is a cross-sectional view of the semiconductor device during a manufacturing step thereof following that of FIG. 2.

Next, as shown in FIG. 3, an n channel MISFET Q1 is formed in an active region of the element region 1A, that is, a region in which the main surface of the semiconductor substrate SB is exposed from the element isolation region EI, while an n channel MISFET Q2 is formed in an active region of the element region 1C. The step of forming the MISFETs Q1 and Q2 is started by implanting a p type impurity (for example, B (boron)) into the main surface of the semiconductor substrate SB in the element regions 1A and 1C to form a well WL which is a p type semiconductor region. The well WL thus formed is deeper than the trench filled with the element isolation region EI.

Then, a thick insulating film is formed on the main surface of the semiconductor substrate SB in the element region 1A having the well WL therein and a thin insulating film is formed on the main surface of the semiconductor substrate SB in the element region 1C having the well WL therein. After forming a polysilicon film on each of these insulating films, the polysilicon film and the insulating films are processed by photolithography and etching to form a gate insulating film GI1 made of the thick insulating film and a gate electrode GE1 made of the polysilicon film in the element region 1A. Also by this processing, a gate insulating film GI2 made of the thin insulating film and a gate electrode GE2 made of the polysilicon film are formed in the element region 1C. The thick insulating film and the thin insulating film can be formed, for example, by thermal oxidation or CVD. The polysilicon film can be formed, for example, by CVD.

The thickness of the gate insulating film GI1 in the element region 1A is greater than that of the gate insulating film GI2 in the element region 1C and the length (gate length) of the gate electrode GE1 in the element region 1A in a direction along the main surface of the semiconductor substrate SB is greater than the length (gate length) of the gate electrode GE2 in the element region 1C along a direction along the main surface of the semiconductor substrate SB.

Then, formed are a sidewall SW made of an insulating film that covers the respective side walls of the gate electrodes GE1 and GE2 and a pair of source and drain regions SD formed in the main surface of the semiconductor substrate at the side of the gate electrodes GE1 and GE2 so as to sandwich the gate electrodes GE1 and GE2, respectively. This results in the formation of a MISFET Q1 having the gate electrode GE1 and the source and drain regions SD and a MISFET Q2 having the gate electrode GE2 and the source and drain regions SD.

Here, for example, after successive formation of a silicon oxide film and a silicon nitride film by CVD or the like so as to cover the main surface of the semiconductor substrate SB and the gate electrodes GE1 and GE2, the main surface of the semiconductor substrate SB is exposed by dry etching. By this processing, the side walls SW made of a stacked film including the silicon oxide film and the silicon nitride film and adjacent to the respective side walls of the gate electrodes GE1 and GE2 are formed in self alignment.

In the step of forming the source and drain regions SD, for example, an n type impurity (for example, phosphorus (B) or arsenic (As)) is implanted into the main surface of the semiconductor substrate SB by ion implantation while using the gate electrodes GE1 and GE2 as a mask (implantation preventive mask) before formation of the side wall SW. By this step, a pair of extension regions having a relatively low impurity concentration is formed in the main surface of the semiconductor substrate SB at the side of each of the gate electrodes GE1 and GE2.

Then, after formation of the side wall SW in the above-described manner, an n type impurity (for example, phosphorus (P) or arsenic (As)) is implanted into the main surface of the semiconductor substrate SB by ion implantation with the gate electrodes GE1 and GE2 and the side wall SW as a mask. By this implantation, a pair of diffusion regions having a relatively high impurity concentration is formed in the main surface of the semiconductor substrate SB at the side of each of the gate electrodes GE1 and GE2.

The extension region is an $n^-$ type semiconductor region and the diffusion region is an $n^+$ type semiconductor region.

The pair of extension regions and the pair of diffusion regions configure the source and drain regions SC. This means that the source region and drain region each have the extension region and the diffusion region adjacent to each other. Thus, the MISFET Q1 of the present embodiment has an LDD (lightly doped drain) structure equipped with the diffusion region and the extension region which is a semiconductor region having an n type impurity concentration lower than that of the diffusion region. In the present embodiment, to facilitate understanding of the drawing, the source and drain regions SD are shown as one semiconductor region without discriminating between the extension region and the diffusion region.

Then, for example, annealing, that is, thermal treatment for activating the impurity introduced in each of the formation steps of the extension region and the diffusion region is performed.

Next, a silicide layer (not shown) covering the respective upper surfaces of the gate electrodes GE1 and GE2 and the source and drain regions SD is formed. Here, the silicide layer is formed using a known salicide (self aligned silicide) process. This makes it possible to reduce the contact resistance between each of the gate electrodes GE1 and GE2 and the source and drain regions SD and a contact plug (coupling portion) formed later. No silicide layer is formed on the surface of the insulating film such as the element isolation region EI and the sidewall SW.

Figure 4:
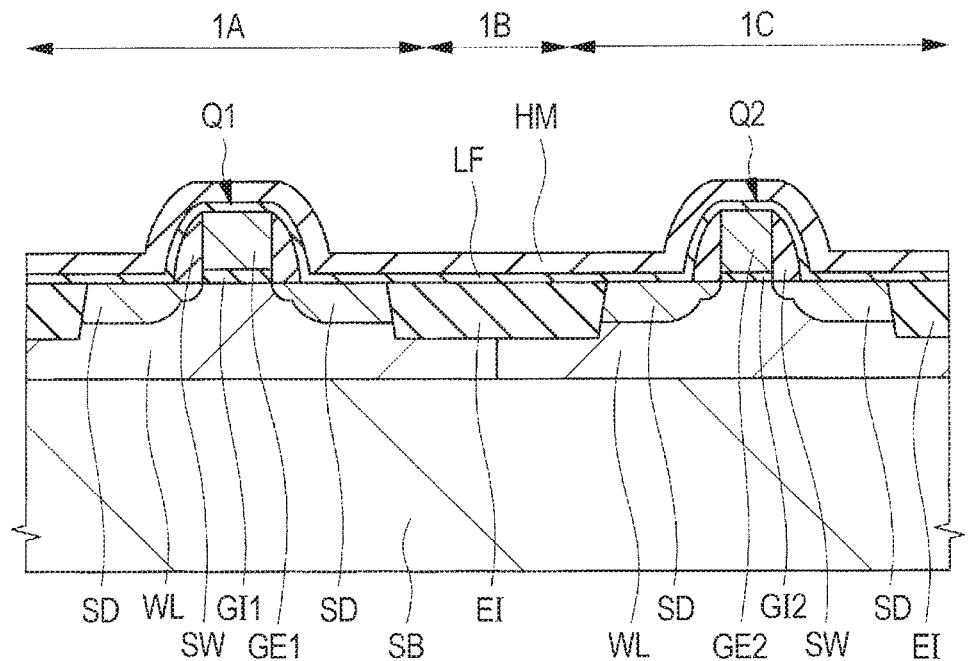
FIG. 4 is a cross-sectional view of the semiconductor device during a manufacturing step thereof following that of FIG. 3.

Next, as shown in FIG. 4, an insulating film LF and an insulating film HM are formed successively as a liner film and a hard mask, respectively, on the main surface of the semiconductor substrate SB. The insulating films IF and HM are formed by CVD so as to cover the upper surface of the element isolation region EI, the main surface of the semiconductor substrate SB, and the MISFET Q1. The insulating film LF is made of, for example, a silicon nitride film and the insulating film HM is made of, for example, an $O_3$TEOS (tetra ethyl ortho silicate) film. The insulating film HM is thicker than the insulating film LF. The insulating film HM has a thickness of, for example, about 200 nm. After deposition of the insulating film HM, the surface of the insulating film HM is planarized if necessary by CMP or the like.

The insulating film HM made of a silicon oxide film is formed by CVD with a gas containing an ozone ($O_3$) gas and a tetraethoxysilane (TEOS) gas. The silicon oxide film formed by CVD using a gas containing an $O_3$ gas and a TEOS gas is called "$O_3$TEOS film".

The insulating film LE made of a silicon nitride film functions as an etching stopper film in forming a DTI structure which will be described later referring to FIG. 5 or an etching stopper film in forming a contact hole CH which will be described later referring to FIG. 14.

Next, as shown in FIG. 5, an opening portion OP penetrating the insulating films HM and LF and the element isolation region EI is formed in the isolation region 1B. The opening portion OP reaches the surface of the semiconductor substrate SB in a region where the DTI structure is to be formed.

First, a photoresist film (not shown) is applied onto the insulating film HM and the photoresist film thus obtained is patterned by photolithography. Thus, a resist pattern having an opening portion penetrating the photoresist film thus formed and reaching the insulating film HM is formed. With the resist pattern as an etching mask, the insulating film HM, the insulating film LF, and the element isolation region EI are etched successively. An opening portion penetrating the insulating film HM, the insulating film LF, and the element isolation region EI is thus formed. The width of the opening portion OP (opening width) in a direction along the main surface of the semiconductor substrate SB is, for example, from 0.8 to 1.0 μm.

Next, as shown in FIG. 6, a trench portion TP is formed in the upper surface of the semiconductor substrate SB right under the opening portion OP. The trench portion TP is formed in the following manner. For example, after removal of the photoresist film, the semiconductor substrate SB exposed from the bottom surface of the opening portion OP is etched by dry etching with the insulating film HM, the insulating film LF, and the element isolation region EI having therein the opening portion OP as an etching mask. By this etching, a trench portion TP communicated with the opening portion OP in the surface of the semiconductor substrate SB and reaching the middle in the thickness direction of the semiconductor substrate SB is formed on the upper surface of the semiconductor substrate SB exposed from the bottom surface of the opening portion OP.

The trench portion TP can have a depth of, for example, 15 μm and have a width of, for example, 1 μm in a direction along the main surface of the semiconductor substrate SB. The formation depth of the trench portion TP is greater than that of the well WL. As shown in FIG. 6, the width of the trench portion TP is presumed to become greater than the width of the opening portion OP.

In the example shown in FIG. 6, the trench portion TP is formed a region overlapping with the element isolation region EI in plan view, but the trench portion TP may be formed in a region not overlapping with the element isolation region EI in plan view.

The trench portion TP may surround either one of the semiconductor element MISFET Q1 or Q2 in plan view. A partially cutaway perspective view of the semiconductor substrate SB during the manufacturing step shown in FIG. 6 is shown in FIG. 7. As shown in FIG. 7, the element region 1A having the high-breakdown-voltage MISFET Q1 therein is surrounded, in plan view, with the trench portion TP included in the DTI structure to be formed later. The trench portion TP is formed in the main surface of the semiconductor substrate SB. FIG. 7 shows only the semiconductor substrate SB and from this drawing, the semiconductor element and the insulating films such as insulating films LF and HM are omitted.

Although not shown, in the element region 1C (for example, in a logic region) having the low-break-down voltage MISFET Q2 therein, a region having the MISFET Q2 formed therein may be surrounded, in plan view, with the trench portion TP configuring the DTI structure which will be formed later. The term "in plan view" as used herein means a view when the main surface of the semiconductor substrate SB is viewed from above in a direction perpendicular to the main surface.

For the formation of a trench portion TP having a high aspect ratio, which means a high depth:width ratio, by dry etching, a step of etching the semiconductor substrate SD with a gas containing, for example, a sulfur hexafluorde ($SF_6$) gas and a step of covering the side surface of the trench portion TP with a gas containing, for example, a carbon fluoride (fluorocarbon) gas such as $C_4F_8$ gas are performed repeatedly. Although not shown here, magnifying observation of the trench portion TP shows that a wide portion and a narrow portion are formed alternately along the depth direction by this repetition and the trench portion TP has, on the side surface thereof, irregularities called "scallop". The shape of the scallop will be described later referring to FIG. 18.

Figure 8:
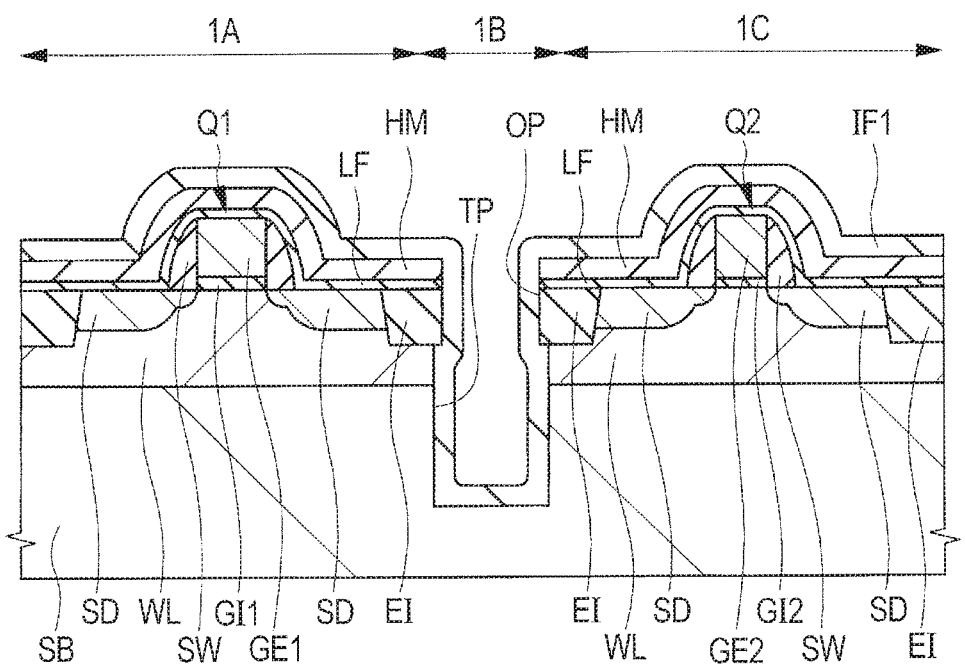
FIG. 8 is a cross-sectional view of the semiconductor device during a manufacturing step thereof following that of FIG. 6.

Next, as shown in FIG. 8, an insulating film is formed which covers therewith the main surface of the semiconductor substrate SB, the side wall of the opening portion OP, the side wall of the trench portion TP, and the bottom surface of the trench portion TP. In this step, an insulating film IF1 made of a silicon oxide film is formed by CVD using a gas containing an ozone ($O_3$) gas and a tetraethoxysilane (TEOS) gas in the opening portion OP, in the trench portion TP, and on the surface of the semiconductor substrate SB. In addition, the MISFETs Q1 and Q2 which are semiconductor elements are covered with the insulating film. This means that the insulating film IF1 is made of an $O_3$TEOS film. The insulating film IF1 has a thickness of, for example, 200 nm.

As a material of the insulating film IF1, PSG (phosphosilicate glass) or BPSG (borophosphosilicate glass) can be used as well as $O_3$TEOS. When PSG or BPSG is used, a P (phosphorus) content in these materials is increased in order to provide the insulating film IF1 having improved step coverage and flowability.

The insulating film IF1 cannot fill the trench portion TP completely. The insulating film IF1 covering one of the side walls of the trench portion TP and the insulating IF1 covering the other side wall which is opposite to the above one are not contiguous to each other.

The insulating film IF1 made of a silicon oxide film can be formed preferably by quasi-atmospheric pressure CVD as CVD using a gas containing an $O_3$ gas and a TEOS gas. The pressure at the time of film formation by quasi-normal-pressure CVD is smaller than atmospheric pressure, which is a pressure at the time of film formation by normal-pressure CVD, and at the same time, greater than a pressure of from about 13 to 390 Pa at the time of film formation by reduced-pressure CVD. Therefore, the pressure is, for example, greater than 390 Pa and smaller than 0.1 MPa.

Figure 9:
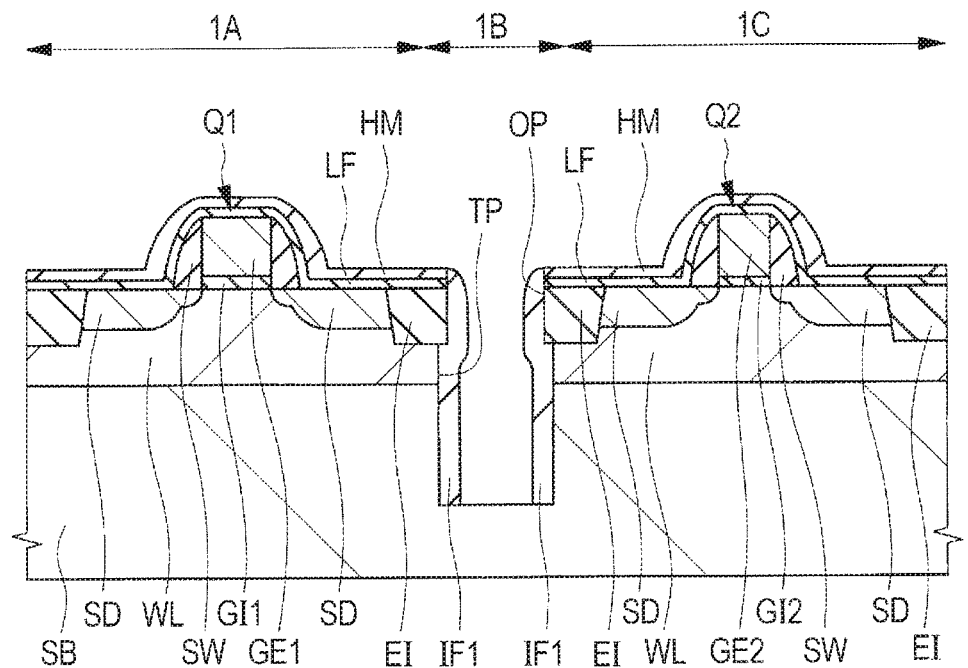
FIG. 9 is a cross-sectional view of the semiconductor device during a manufacturing step thereof following that of FIG. 8.

This $O_3$TEOS film has both good step coverage and good flowability. The flowability of a film is described in FIG. 9 of M. Matsuura et al., "Film characteristics of APCVD oxide using organic silicon and ozone", Japanese Journal of Applied Physics, Vol. 30, 1991, pp. 1530-1538. According to this document, the term "a film has good flowability" means that, for example, when a corner portion is covered with a certain film, the whole film is planarized due to a decrease in the thickness of a portion of the film covering the corner portion. As shown in FIG. 9 of the above-mentioned document, a film has better flowability and the whole film can be planarized when a ratio of the minimum distance between the corner portion and the surface of the portion of the film covering the corner portion is smaller than the thickness of a portion of the film covering a planar portion.

Figure 18:
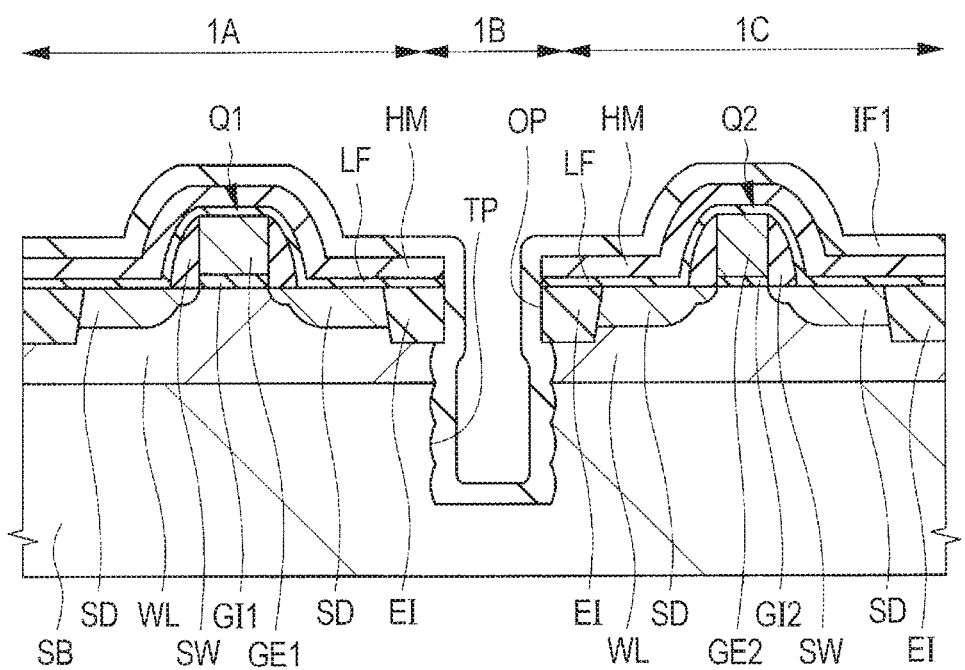
FIG. 18 is a cross-sectional view specifically showing the constitution of the semiconductor device shown in FIG. 8 during the manufacturing step thereof.

Even when the trench portion TP has, on the side surface thereof, irregularities called "scallop" as shown in FIG. 18, the insulating film IF1 formed on the side surface of the trench portion TP can have a flat surface by forming the insulating film IF1 made of an $O_3$TEOS film on the side surface of the trench portion TP. In other words, it is necessary to form the insulating film IF1 having good flowability in order to cover such irregularities and thereby planarizing the surface in the trench portion TP. FIG. 18 is a cross-sectional view specifically showing the structure shown in FIG. 8 and it shows the irregularities of the side wall of the trench portion TP which are not illustrated in FIG. 8.

As shown in FIG. 18, the trench portion TP has, on the side wall thereof, irregularities. They are formed repeatedly from the upper end to the lower end of the side wall of the trench portion TP. In other words, the trench portion TP has, from the upper end to the lower end of the side wall thereof, a large-width portion and a small-width portion alternately and repeatedly. The width means a width in a direction along the main surface of the semiconductor substrate SB.

The insulating film IF1 having good step coverage and good flowability is superior in covering property. This means that the insulating film IF1 is a film having good coverage. As shown in FIG. 8, there is a small difference between the film thickness of the insulating IF1 formed on the side wall of a certain layer and the film thickness of the insulating film IF1 covering the upper surface of the certain layer. In other words, a ratio of the film thickness of the insulating film IF1 that covers the upper surface of the certain to the film thickness of the insulating film. IF1 formed on the side wall of the certain layer is relatively small.

The film thickness of the insulating film IF1 on the insulating film HM is almost equal to the film thickness of the insulating film IF1 covering the side wall of the trench portion TP. The term "film thickness" as used herein means a length of a certain film in direction perpendicular to an underlying surface on which the certain film has been formed. For example, therefore, the film thickness of the insulating film FI1 that covers the side wall of the opening portion OP extending in a direction perpendicular to the main surface of the semiconductor substrate SB means a length of the insulating film IF1 contiguous to the side wall lying under the insulating film IF1 and at the same time, a thickness in a direction along the main surface of the semiconductor substrate SB.

Next, as shown in FIG. 9, the upper surface of the insulating film IF1 is caused to retreat and the insulating film IF1 right above the insulating film HM is removed by etch-back by dry etching, which is anisotropic etching. This means that the upper surface of the insulating film HM is exposed from the insulating film IF1. The MISFETs Q1 and Q2 are therefore exposed from the insulating film IF1. More specifically, the gate electrodes GE1 and GE2 and the source and drain regions SD are exposed from the insulating film IF1.

By this etch-back step, the upper surface of the insulating film IF1 at the bottom portion of the trench portion TP also retreats and the surface of the semiconductor substrate SB which is the bottom surface of the trench portion TP is exposed. In other words, only a portion of the insulating film IF1 which is in the trench portion TP and covers the side wail of the trench portion TP remains, while a portion of the insulating film IF1 that covers the bottom portion of the trench portion TP is removed. The side walls of the opening portion OP, that is, the respective side walls of the insulating films HM and LF and the element isolation region EI are contiguous to the insulating film IF1 and are covered with the insulating film IF1.

In this step, for example, a silicon oxide film having a thickness of 300 nm in a direction perpendicular to the main surface of the semiconductor substrate SB is selectively removed. On the main surface of the semiconductor substrate SB, after removal of the total thickness of the insulating film IF1 by etch-back, the upper surface of the insulating film HM is caused to retreat by the etch-back. The total thickness of the insulating film HM is however not removed so that the upper surface of the insulating film LF is not exposed. In short, the insulating film HM becomes thin by the etch-back and the upper surface of the insulating film LF remains covered with the insulating film HM.

Here, as one example, the insulating film HM having a film thickness of 200 nm is etched back to remove a 100-nm portion of the film. This etch-back is performed by dry etching, which is anisotropic etching, so that a retreat amount of the thickness of the insulating film HM covering the side wall of the sidewall SW is smaller than that of the insulating film HM extending along the upper surface of the insulating film LF. After completion of the etch-back step, the film thickness of the insulating film HM covering the side wall of the sidewall SW is greater than the film thickness of the insulating film HM extending along the upper surface of the insulating film LF.

The reason why the insulating film LF is etched back while preventing its exposure is because removal of the insulating film LF by excessive etch-back is prevented. If the insulating film LF is removed, the insulating film LF cannot be used as an etching stopper film during a formation step of a contact hole (refer to FIG. 13) which will be performed later.

Here, it is however desired to cause the upper surface of the insulating film HP to retreat by the above etch-back step so as not to expose the upper surface of the insulating film LF and thereby lower the upper surface of the insulating film IF1 that covers the side wall of the opening portion OP. This makes it possible to lower a closed position of the upper portion of a space to be formed in the trench portion TP in a later step.

By this etch-back step, the insulating film remains only at a position along the respective side walls of the opening portion OP and the trench portion TP. The eaves-like bottom surface protrusion of the element isolation region EI is also covered with the insulating film IF1.

The insulating film IF1 thus etched back is rounded at the corner portion thereof. Described specifically, the corner portion which is a boundary between the the upper surface of the insulating film IF1 contiguous to the side wall of the opening portion OP and the side wall of the insulating film IF1 on the side of the center portion of the opening portion OP is dry-etched so that it is rounded. The corner portion therefore has a curved cross-section with a large radius. This corner portion has a gentler curve as the shaving amount of the silicon oxide film by etch-back becomes larger. Thus, the shaving of the corner portion at the upper portion of the insulating film TF1 means that a position, at which a distance between the respective insulating films IF1 contiguous to the side walls of the opening portion OP opposite to each other becomes the shortest, is lowered to the bottom surface side of the trench portion TP.

Figure 10:
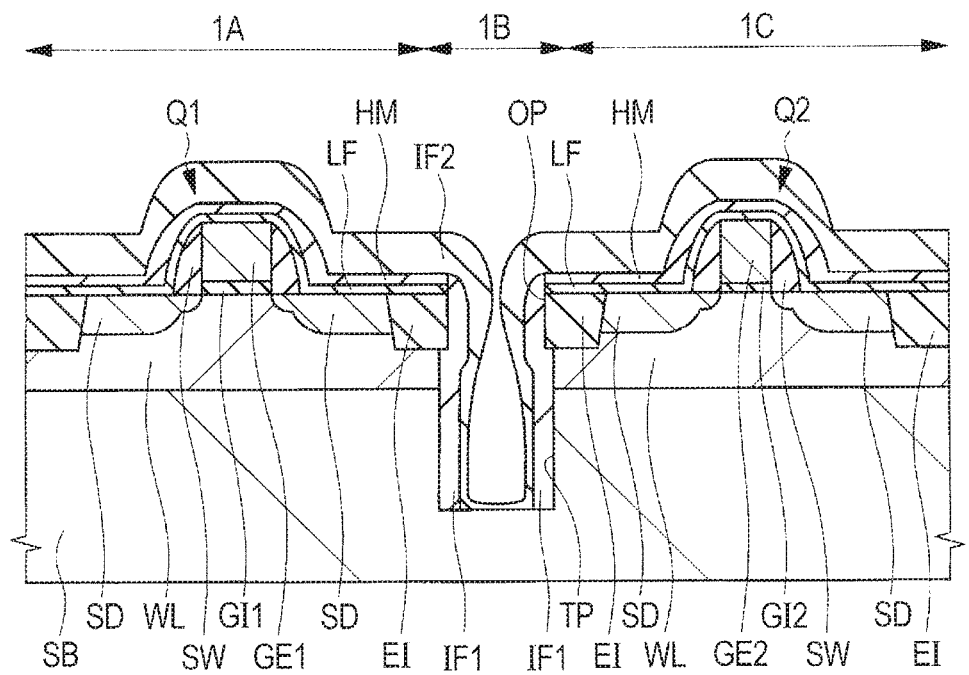
FIG. 10 is a cross-sectional view of the semiconductor device during a manufacturing step thereof following that of FIG. 9.

Next, as shown in FIG. 10, an insulating film IF2 is formed on the semiconductor substrate SB and inside the trench portion TP. Here, the insulating film IF2 made of a silicon oxide film is formed on the insulating film IF1 by plasma-enhanced chemical vapor deposition (PECVD). The insulating film IF2 covers the side wall of the opening portion OP and the side wall of the trench portion TP via the insulating film IF1. This means that the insulating film IF2 covers the side wall of the insulating film IF1 on the side opposite to the side wall of the trench portion TP. In addition, the insulating film IF2 covers the bottom surface of the trench portion TP and the upper surface of the insulating film HM and is in direct contact with the bottom surface of the trench portion TP and the insulating film HM.

For example, the insulating film IF2 made of silicon oxide film can be formed by PECVD using a gas containing a tetraethoxysilane (TEOS) gas. The silicon oxide film formed by PECVD using a gas containing a TEOS gas is called "PTEOS film".

The insulating film IFS made of a silicon oxide film can also be formed by PECVD using a gas containing a silane ($SiH_4$) gas instead of a TEOS gas. The silicon oxide film formed by PECVD using a gas containing a $SiH_4$ gas is called "P-SiO film".

As a material of the insulating film IF2, NSG (non-doped silicate glass), PSG, or BPSG can be used as well as PTEOS film and P-SiO film. When PSG or BPSG is used, a P (phosphorus) content of these materials is decreased in order to reduce the step coverage and flowabilty of the insulating film IF2. This means that when PSG or BPSG is used for each of the insulating films IF1 and IF2, a P (phosphorus) content of the insulating film IF1 is greater than a P (phosphorus) content of the insulating film IF2. The step coverage and flowability of these materials are greater in the following order: NSG, PSG, and BPSG. A film made of PTEOS, P-SiO, NSG, PSG, or BPSG may be called "PTEOS film or the like".

The step coverage of the PTEOS film or the like is lower than the step coverage of the insulating film IF1 made of an $O_3TEOS$ film. The flowability of the PTEOS film or the like is lower than the flowability of the $O_3TEOS$ film. This means that the insulating film IF2 has such properties as inferior film performance and coverage. When a layer having a side wall and an upper surface is covered with the insulating film IF2, the film thickness of the insulating film IF2 formed on the side wall is smaller than the film thickness of the insulating film IF2 formed on the upper surface. In particular, the film thickness of the insulating film IF2 extending along the side wall is smaller on the lower side and greater on the upper side.

There is therefore a relatively large difference in the film thickness between the insulating film IF2 formed on the side wall of a certain layer and the insulating film IF2 covering the upper surface of the certain layer. In other words, a ratio of the film thickness of the insulating film IF2 covering the upper surface of a certain layer to the film thickness of the insulating film IF2 formed on the side wall of the certain layer is relatively large. When the insulating film IF1 and the insulating film IF2 are compared, a ratio of the film thickness of the insulating film IF1 on the insulating film HM to the film thickness of the insulating film IF1 formed on the side wall of the trench portion TP is smaller than a ratio of the film thickness of the insulating film IF2 on the insulating film HM to the film thickness of the insulating film IF2 formed on the side wall of the trench portion TP.

The closer to the opening end of the opening portion OP, the greater the film thickness of the insulating film IF2 formed on the side surface of the opening portion OP and the side surface of the trench portion TP.

In other words, the film thickness of the insulating film IF2 formed on the side surface of the opening portion OP is greater than the film thickness of the insulating film IF2 formed on the side surface of the upper portion of the trench portion TP and the film thickness of the insulating film IF2 formed on the side surface of the upper portion of the trench portion TP is greater than the film thickness of the insulating film IF2 formed on the side surface of the bottom portion of the trench portion TP. The closer to the opening end of the opening portion OP, the shorter the distance can be made between the respective insulating films IF2 formed on the both side surfaces of the opening portion OP and on both side surfaces of the trench portion TP. Such an effect is enhanced when the insulating film IF2 is made of a PTEOS film or the like.

More specifically, as shown in FIG. 10, the film thickness of the insulating film IF2 formed on the side surface of the trench portion TP is smaller than the film thickness of the insulating film IF2 formed on the side surface of the opening portion OP. The distance between the respective insulating films IF2 formed on both side surfaces of the trench portion TP can be made greater than the distance between the respective insulating films IF2 formed on both side surfaces of the opening portion OP.

Preferably, in the step of forming the insulating film IF2, the insulating film IF2 is formed so as not to close the trench portion TP at any position in plan view. This makes it possible to close the trench portion TP with an insulating film IF3 to be formed in a step described later referring to FIG. 11. In the step of forming the insulating film IF2, however, a space may be formed in the trench portion TP by closing the insulating films IF2 right above the trench portion TP.

The film thickness of the insulating film IF2 to be formed on the side surface of the opening portion OP can be set at, for example, 250 nm. As described above, supposing that the width of the trench portion TP is set at, for example, 1 μm and the film thickness of the insulating film IF1 to be formed on the side surface of the trench portion TP is set at, for example, 100 nm, the distance between the respective insulating films IF2 to be formed on both side surfaces of the opening portion OP can be set at, for example, at 300 nm.

Even if the insulating film IF2 is formed, the trench portion TP is not completely filled therewith. The insulating film IF2 covering one of the side wails of the trench portion TP is not is contact with the insulating film IF2 covering the other side wall which is a side wall opposite to that described above. The insulating film IF2 covering one of the side wall of the opening portion OP however may be in contact with the insulating film IF2 covering the other side wall, which is a side wall opposite to that described above. This means that the insulating film IF2 may be closed right above the trench portion TP. Even if the insulating films IF2 are closed, the upper surface of the closed position is recessed relative to the upper surface of the insulating film IF2 in the other region. It is therefore necessary to form an insulating film IF3 for filling the recess therewith in the following manner in order to form an interlayer insulating film having a flat upper surface.

Figure 11:
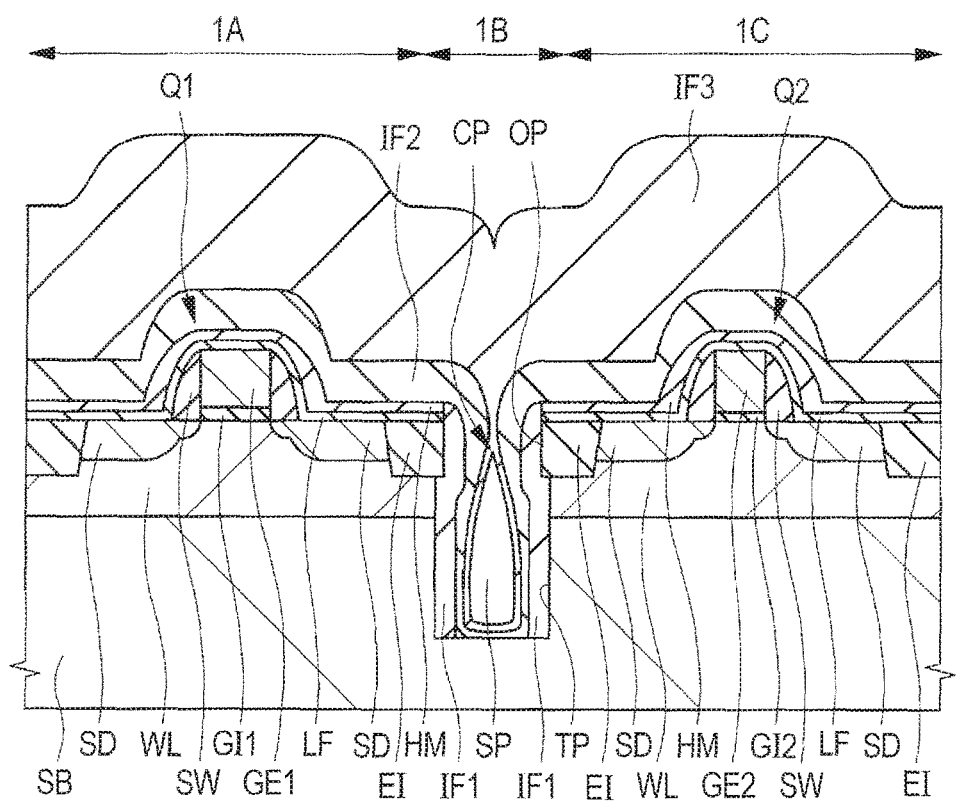
FIG. 11 is a cross-sectional view of the semiconductor device during a manufacturing step thereof following that of FIG. 10.

Next, as shown in FIG. 11, an insulating film IF3 is formed on the semiconductor substrate SB, inside the trench portion TP, and on the insulating film IF2. In this step, the insulating film IF3 made of a silicon oxide film is formed on the insulating film IF2 by CVD using a gas containing an ozone ($O_3$) gas and a tetraethoxysilane (TEOS) gas. In addition, the trench portion TP is closed with the insulating film IF3 while leaving a space SP in the trench portion TP. Due to the space SP thus formed, even if the insulating film IF3 is formed, the trench portion TP is not completely filled therewith.

Preferably, the insulating film IF3 made of a silicon oxide film can be formed by quasi-atmospheric pressure CVD as CVD using a gas containing an $O_3$ gas and a TEOS gas. The pressure at the time of film formation by quasi-normal-pressure CVD is smaller than atmospheric pressure, which is a pressure at the time of film formation by normal-pressure CVD and at the same time, greater than from about 13 to 390 Pa, which is a pressure at the time of film formation by reduced pressure CVD. For example, the pressure is therefore greater than 390 Pa and smaller than 0.1 MPa.

Similar to the insulating film IF1, the silicon oxide film formed by CVD using a gas containing an $O_3$ gas and a TEOS gas is called "$O_3$TEO film". This $O_3$TEOS film has both good step coverage and good flowability. This means that the $O_3$TEAS film has step coverage higher than that of a PTEOS film or the like and the $O_3$TEOS film has flowability higher than that of a PTEOS film or the like. In short, the insulating film IF3 has flowability and step coverage higher than those of the insulating film IF2.

The film thickness of the insulating film IF3 formed on the side surface of the opening portion OP is therefore substantially equal to the film thickness of the insulating film IF3 formed on the side surface of the trench portion TP. The trench portion TP can therefore be closed while leaving the space SP in the trench portion TP by forming the insulating film IF3 made of an $O_3$TEOS film on the side surface of the trench portion TP.

The position of the upper end of the space SP left in the trench portion TP is called "closed position CP". The trench portion TP having, on the side surface thereof, irregularities such as scallop can be covered with good flatness by the insulating film IF1, while the space SP can be left reliably in the trench portion TP by closing the trench portion TP with the insulating films IF2 and IF3. The film thickness of the insulating film IF3 formed on a planar upper surface of the insulating film IF2 on the insulating film HM can be set at, for example, 700 nm.

Figure 12:
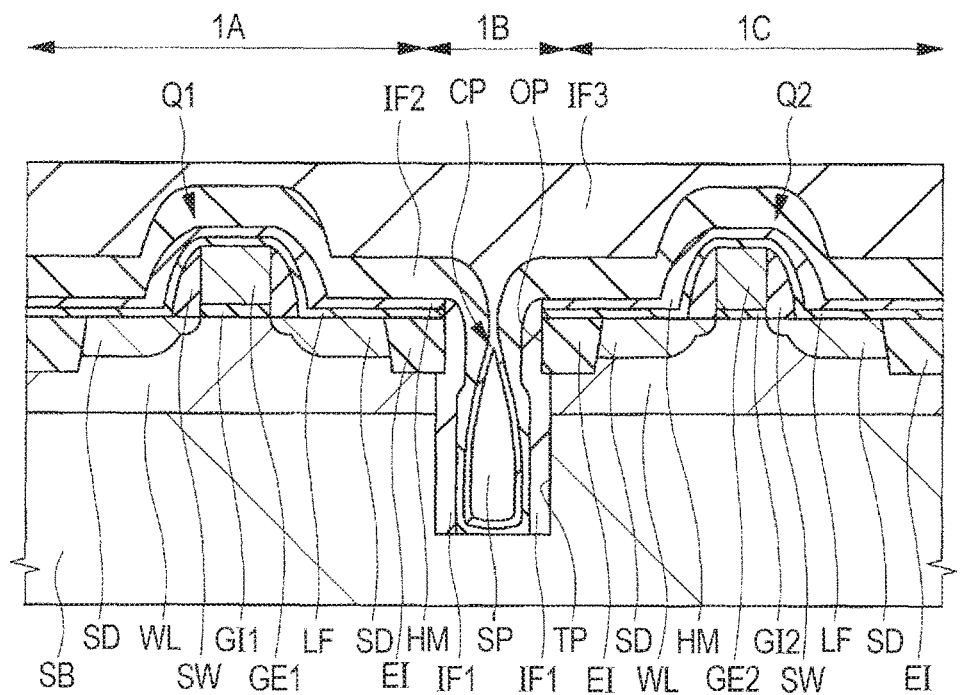
FIG. 12 is a cross-sectional view of the semiconductor device during a manufacturing step thereof following that of FIG. 11.

Next, as shown in FIG. 12, the upper surface of the insulating film IF3 is planarized. The planarization is performed by polishing the upper surface of the insulating film IF3 by using CMP or the like. FIG. 12 shows the structure from which the insulating film IF2 is not exposed by polishing only the insulating film IF3. It is however possible to planarize the respective upper surfaces of the insulating films IF2 and IF3 by polishing and expose the surface of the insulating film IF2. In this polishing step, however, the space SP is not exposed.

Figure 13:
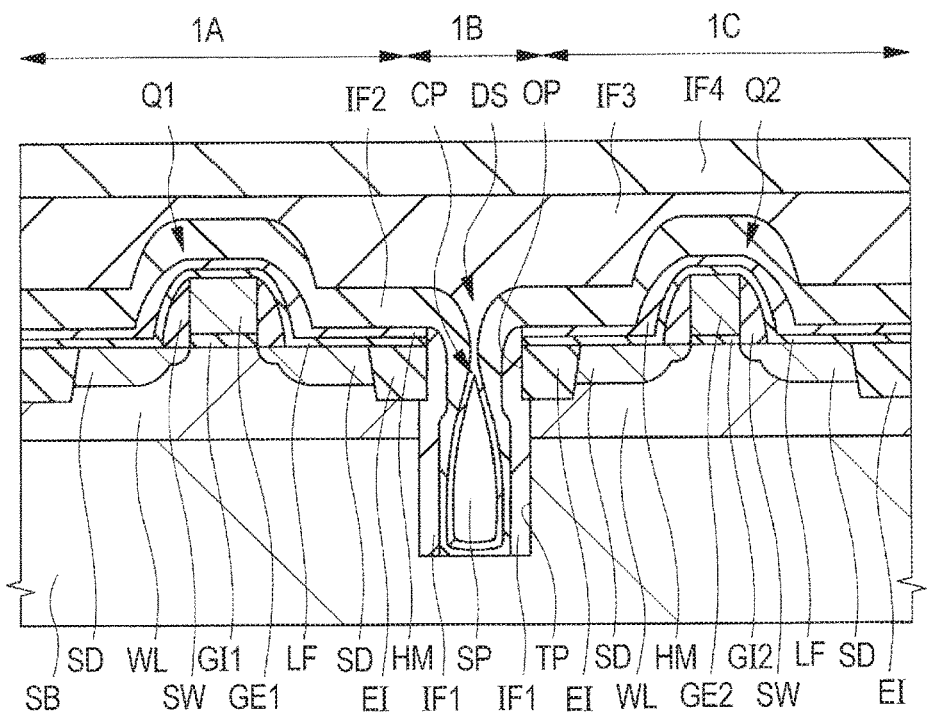
FIG. 13 is a cross-sectional view of the semiconductor device during a manufacturing step thereof following that of FIG. 12.

Next, as shown in FIG. 13, an insulating film IF4 is formed on the insulating film IF3. A stacked insulating film composed of the insulating films IF1, IF2, IF3, and IF4 may hereinafter be called simply "interlayer insulating film". The insulating film IF4 made of a silicon oxide film can be formed by PECVD using a gas containing a tetraethoxysilane (TEOS) gas. Similar to the insulating film IF2, this silicon oxide film formed by PECVD using a gas containing a TEOS gas is called "PTEOS film".

The insulating film IF4 made of a silicon oxide film can also be formed by PECVD using a gas containing a silage ($SiH_4$) gas instead of a TEOS gas. Similar to the insulating film IF2, this silicon oxide film formed by PECVD using a gas containing a $SiH_4$ gas is called "P-SiO film". The insulating film IF4 has a film thickness of, for example, 100 nm.

Thus, as shown in FIG. 13, a DTI structure (element isolation region) DS can be formed. The DTI structure DS of the present embodiment includes, in the main surface of the semiconductor substrate SB, the trench portion TP having a depth greater than that of the element isolation region EI, the insulating film formed in the trench portion TP, and the space SP. This means that the DTI structure DS is equipped with the insulating films IF1, IF2, and IF3 in the trench portion TP. In the present embodiment, the insulating film IF4 is formed as a portion of the interlayer insulating film, but the insulating film IF4 is not always necessary when the flatness of upper surface of the insulating film IF3 can be ensured.

Figure 14:
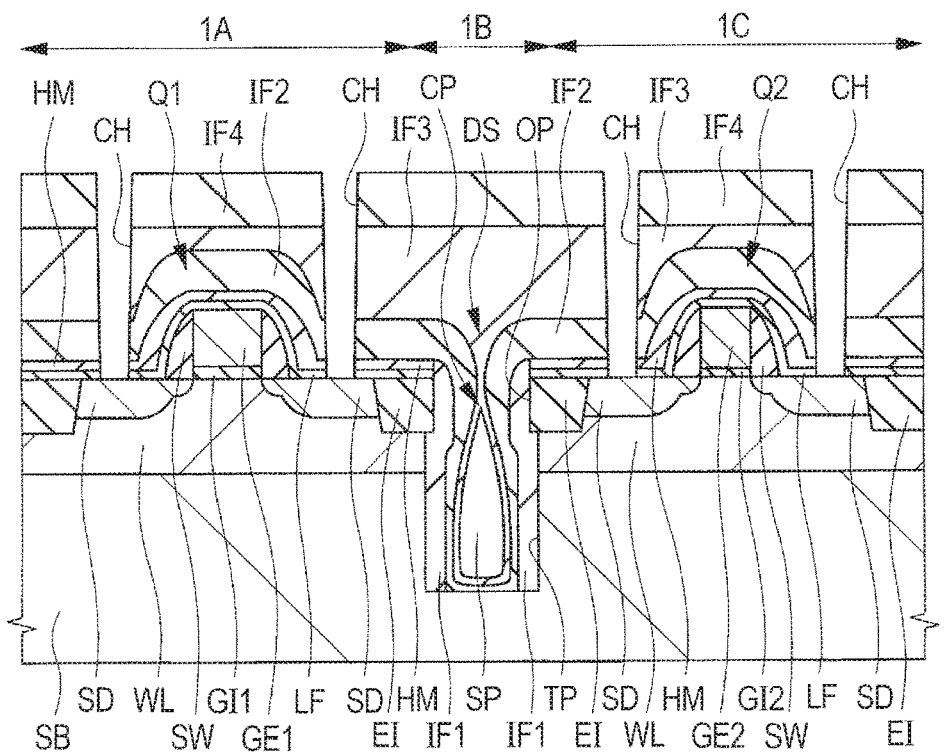
FIG. 14 is a cross-sectional view of the semiconductor device during a manufacturing step thereof following that of FIG. 13.

Next, as shown in FIG. 14, a plurality of contact holes (through-holes) CH penetrating the insulating films IF4, IF3, IF2, IF1, HM, and LF is formed by photolithography and dry etching. When the insulating film IF2 is exposed from the insulating film IF3 by the polishing step described referring to FIG. 12, the contact, hole CH may be opened at the interface between the insulating film IF2 and the insulating film IF4. This means the case where the contact hole CH is not contiguous to the insulating film IF3 or where the contact hole CH does not penetrate the insulating film IF3.

From the bottom portion of the contact hole CH, the upper surface of a silicide layer (not shown) on the upper surface of the source and drain regions SD is exposed. From the bottom portion of the contact hole CH in a region not shown here, the upper surface of a silicide layer (not shown) on the upper surface of each of the gate electrodes GE1 and GE2 is exposed.

In the dry etching step for forming the contact hole CH, the insulating film (liner film) LF is used as an etching stopper film. This makes it possible to prevent an etching amount, in the dry etching, from being excessive or inadequate. In short, the etching can be performed with enhanced accuracy.

Figure 15:
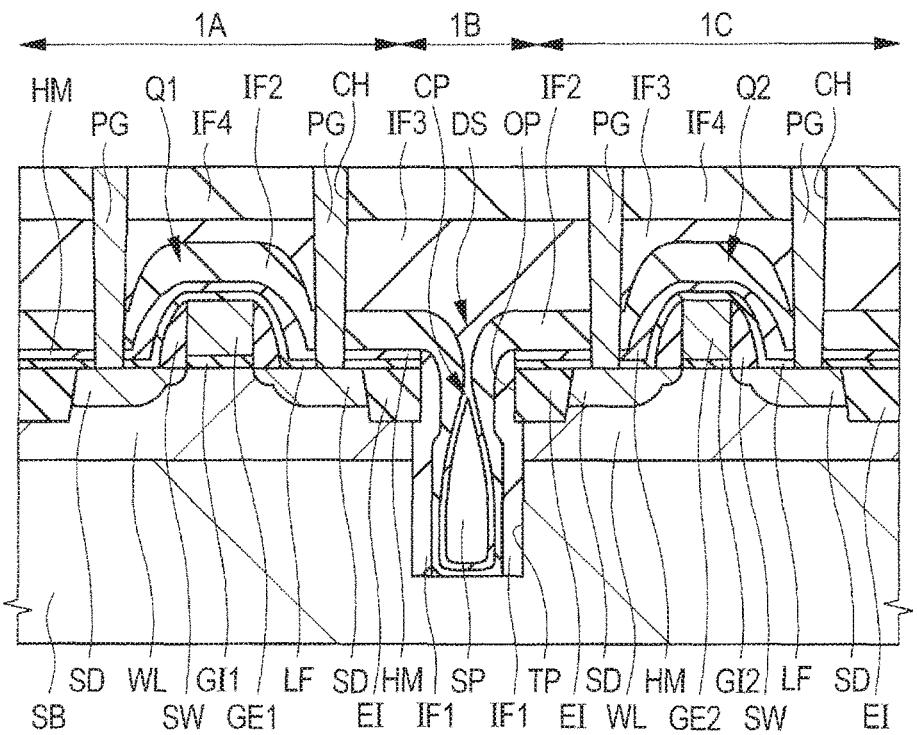
FIG. 15 is a cross-sectional view of the semiconductor device during a manufacturing step thereof following that of FIG. 14.

Next, as shown in FIG. 15, a contact plug PG is formed inside the contact hole CH. For example, after formation of a barrier film made of a titanium nitride film on the interlayer insulating film and inside the contact hole CH by CVD, a conductor film made of a tungsten film is formed on the barrier film by CVD so as to fill the contact hole CH therewith. Then, an unnecessary portion of the conductor film and the barrier film over the interlayer insulating film are removed by CMP or etch-back. In such a manner, a contact plug PG including the conductor film made of, for example, a tungsten film can be formed inside the contact hole CH.

Some of a plurality of the contact plugs PG are electrically coupled to the source and drain regions SD of the MISFET Q1 or Q2 via the silicide layer. Some of the other contact plugs PG are electrically coupled to the gate electrode GE1 or GE2 via the silicide layer at a position not shown here.

Figure 16:
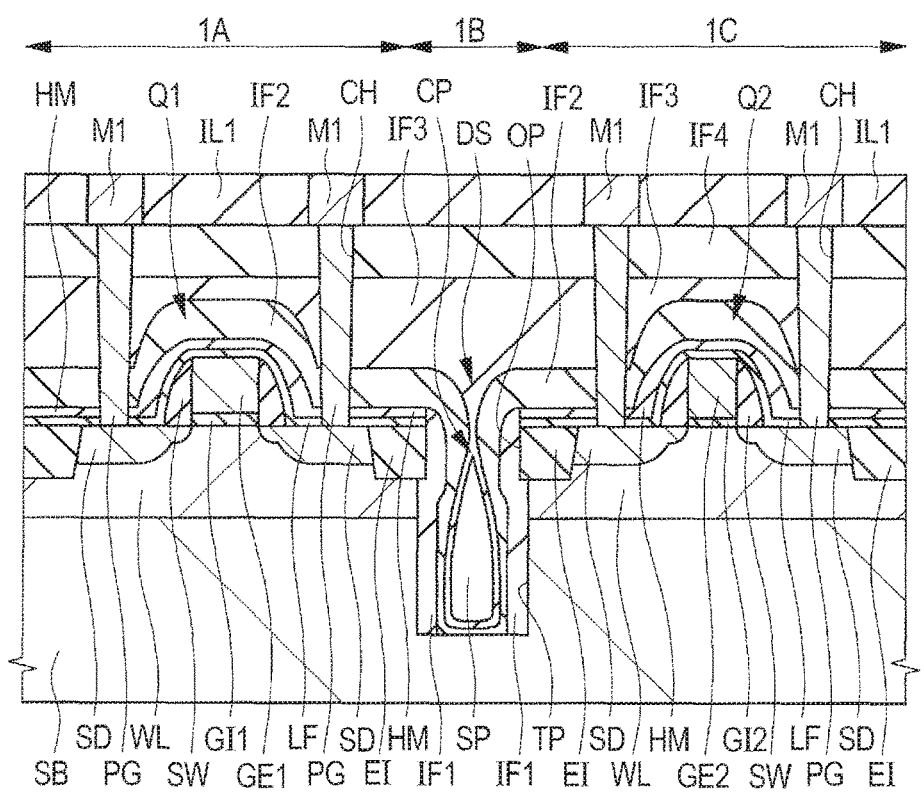
FIG. 16 is a cross-sectional view of the semiconductor device during a manufacturing step thereof following that of FIG. 15.
Figure 17:
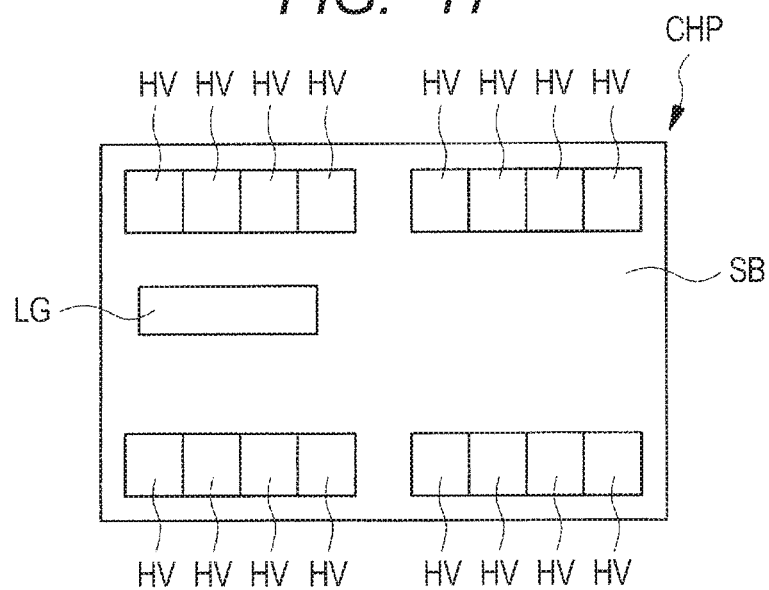
FIG. 17 is a plan view of the semiconductor device during a manufacturing step thereof following that of FIG. 15.

Next, as shown in FIG. 16, an interlayer insulating film IL1 and a first-layer wiring M1 composed mainly of, for example, an aluminum (Al) alloy film are formed on the interlayer insulating film. In this step, an interlayer insulating film IL1 made of a silicon oxide film or the like is formed on the interlayer insulating film including the insulating films IF3 and IF4, for example, by CVD. Then, a plurality of wiring trenches penetrating the interlayer insulating film IL1 is formed using photolithography and etching. From the bottom portion of these wiring trenches, the upper surface of the contact plug PG is exposed.

Then, the wiring trench is filled completely with a barrier conductor film and a main conductor film (for example, aluminum alloy film) formed successively on the interlayer insulating film IL1. Then, an extra portion of the barrier conductor film and the main conductor film on the interlayer insulating film IL1 is removed using CMP or the like to form a wiring M1 comprised of the barrier conductor film and the main conductor film with which each wiring trench has been filled. The wiring M1 is electrically coupled to the contact plug PG. The interlayer insulating film IL1 and the wiring M1 configure a first wiring layer.

Although not illustrated, after formation of a stacked wiring layer comprised of a plurality of wiring layers on the first-layer wiring M1, the semiconductor wafer is diced into individuals. As a result, a plurality of semiconductor chips CHP is formed as the semiconductor device of the present embodiment.

FIG. 17 is a plan view of the semiconductor chip CHP thus formed. As shown in FIG. 17, the semiconductor chip CHP has, for example, the semiconductor substrate SB, an output driver portion HV, and a logic portion LG. The output driver portion HV is a portion including the high-breakdown-voltage MISFET formed on the semiconductor substrate SB and has, for example, a plurality of element regions 1A shown in FIGS. 7 and 16.

In other words, the structure shown in FIG. 7 includes, for example, an output driver portion HV. The output driver portion HV is equipped with a plurality of element regions 1A and the element regions 1A are each surrounded by the trench portion TP. The logic portion LG is a portion including a low-breakdown-voltage CMIS (complementary metal insulator semiconductor)) transistor and the like formed on the semiconductor substrate SB and it corresponds to the element region 1C shown in FIG. 16. The trench portion TP shown in FIG. 7 has a rectangular closed structure in plan view so that the DTI structure DS (refer to FIG. 16) also has a similar closed structure. The DTI structure DS having a closed structure, has inside thereof, one or more semiconductor elements (for example, MISFET Q1 shown in FIG. 16).

The semiconductor substrate SB has, on the main surface thereof, a plurality of the output driver portions HV arranged side by side and the logic portion LG is isolated from the output driver portion HV in plan view. The element region 1A (refer to FIG. 16) in the output driver portion HV and the element region 1C (refer to FIG. 16) in the logic portion LG have therebetween the DTI structure DS (refer to FIG. 16).

As shown in FIG. 16, the trench portion TP and the opening portion OP have therein the insulating film IF1, but the insulating film HM does not have the insulating film IF1 thereon. The insulating film HM has thereon and the trench portion TP has therein the insulating films IF2 and IF3. The trench portion TP is closed with the stacked insulating film including the insulating films IF1 to IF3 while leaving the space SP. This means that the trench portion TP is not completely filled with the stacked insulating film and the trench portion TP has therein the space SP.

The space SP is formed via the insulating films IF1, IF2, and IF3 stacked on the side wall of the trench portion TP successively. In other words, the space SP and the side wall of the trench portion TP have therebetween the insulating films IF1, IF2, and. IF3 stacked successively from the side wall of the trench portion TP.

Since the insulating film IF1 has good coverage and high flowability, the thickness of the film covering the side wall of the trench portion TP is substantially equal at any height position. On the other hand, the insulating film IF2 is inferior in coverage and flowability so that the film thickness of the insulating film IF2 covering the upper portion of the trench portion TP is greater than that of the insulating film IF2 covering the lower portion of the side wall of the trench portion TP.

When the side wall of the trench portion TP has a first region and a second region, the first region present on the lower side and the second region present above the first region are each covered with the insulating films IF1, IF2, and 13. A ratio of the film thickness of the insulating film IF1 covering the second region to the film thickness of the insulating film IF1 covering the first region is smaller than a ratio of the film thickness of the insulating film IF2 covering the second region to the film thickness of the insulating film FI2 covering the first region. A ratio of the film thickness of the insulating film IF3 covering the second region to the film thickness of the insulating film IF3 covering the first region is smaller than a ratio of the film thickness of the insulating film IF2 covering the second region to the film thickness of the insulating film IF2 covering the first region.

The insulating film IF3 that surrounds the space SP and is in direct contact with the space SP is not in direct contact with each of the insulating films IF1 and HM. The insulating film IF3 including the surface of the space SP and the insulating film IF1 or the insulating film HM have therebetween the insulating film IF2.

Element isolation performance can be enhanced by forming the space SP in the trench portion TP compared with filling the trench portion TP with an insulating film. This means that a leakage current between elements isolated by the DTI structure DS can be reduced and a breakdown voltage can be increased and at the same time, field intensity at a position contiguous to the trench portion can be relaxed. As in the present embodiment, when a MISFET having a breakdown voltage higher than that of a low-breakdown-voltage MISFET used for switching or the like is formed in the logic portion LG (refer to FIG. 17), a great advantage can be obtained by reducing the leakage current of the high-breakdown-voltage MISFET isolated by the DTI structure DS, enhancing the breakdown voltage, and relaxing the field intensity at a position contiguous to the trench portion TP.

In addition, by forming the space SP in the trench portion TP, action of an electric field from an adjacent element so as to interfere with the extension of a depletion layer, that is, a reverse field plate effect can be suppressed, leading to enhancement of an isolation breakdown voltage. Further, a stress in the trench portion TP can be reduced by forming the space SP in the trench portion TP and therefore, generation of crystal defects due to the stress can be suppressed.

Preferably, the trench portion TP is present in a region overlapping with the element isolation region EI in plan view. This makes it possible to relax stress concentration on the upper portion of the trench portion TP and thereby suppress generation of crystal defects further.

<Closed Position>

Figure 19:
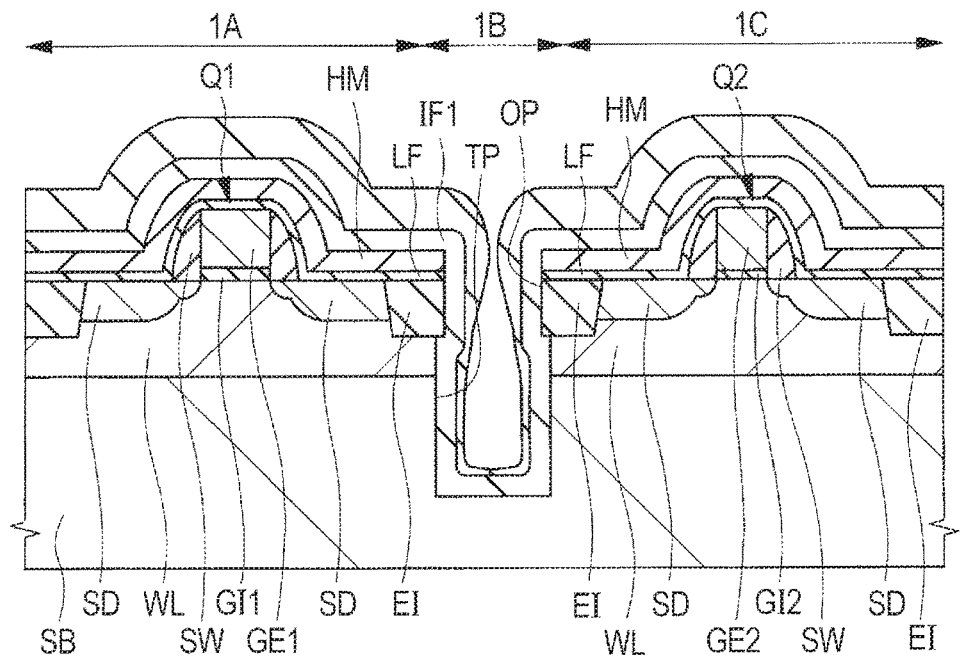
FIG. 19 is a cross-sectional view of a semiconductor device of Comparative Example during the manufacturing step thereof.
Figure 20:
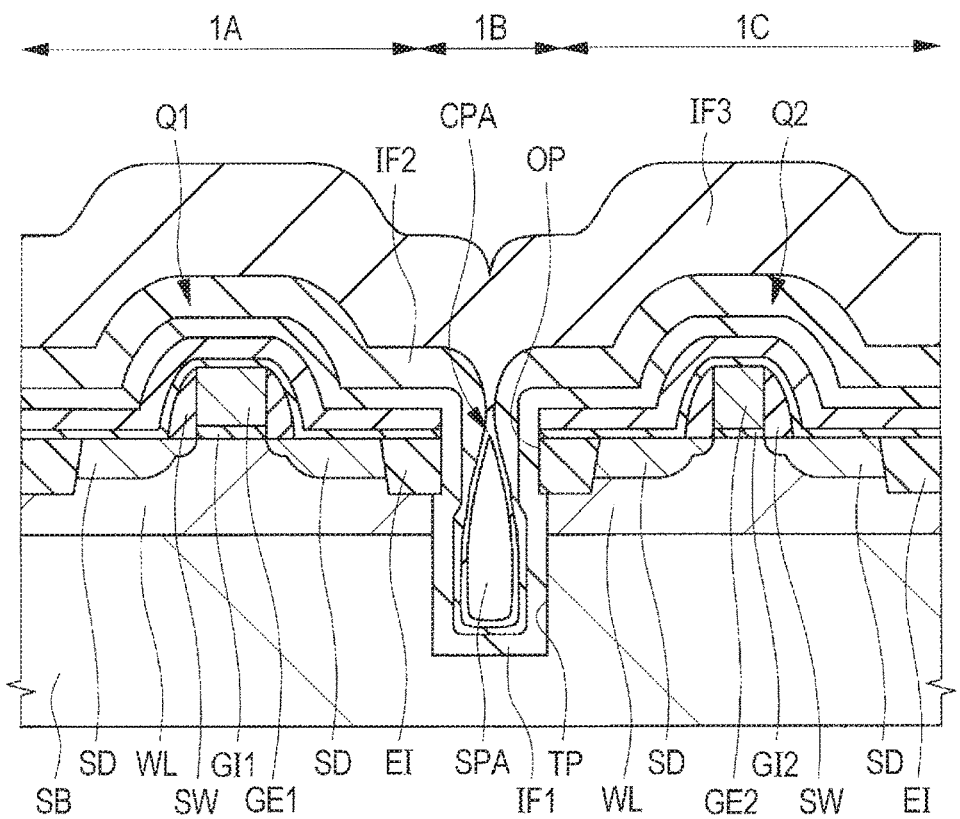
FIG. 20 is a cross-sectional view of the semiconductor device during the manufacturing step thereof following that of FIG. 19.

Next, a description will be made on the closed position of the space during closing the trench portion while leaving the space in the trench portion, based on comparison with a method of manufacturing a semiconductor device according to Comparative Example. FIGS. 19 and 20 are cross-sectional views of the semiconductor device of Comparative Example during its manufacturing steps.

In the method of manufacturing a semiconductor device according to Comparative Example, first, the steps described referring to FIGS. 1 to 8 are performed as shown in FIG. 19. By these steps, the insulating film IF1 having high flowability can be formed in the trench portion TP to cover the irregularities formed on the side wall of the trench portion TP and thereby planarize the surface in the trench portion TP. Then, formation of the insulating film IF2 described referring to FIG. 10 is performed without carrying out the etch-back step described referring to FIG. 9.

In other words, after formation of the insulating film IF1 having good step coverage and therefore having high coverage performance, the insulating film IF2 inferior to the insulating film IF1 in step coverage and coverage performance is deposited on the insulating film IF1 and also in the trench portion TP. Different from the present embodiment. (refer to FIG. 10), the upper surface of the insulating film HM and the insulating film IF2 are not contiguous to each other in Comparative Example. This means that the upper surface of the insulating film HM and the insulating film IF2 have therebetween the insulating film IF1. MISFETs Q1 and Q2 of Comparative Example are covered, at the upper portion thereof, with the insulating film IF1.

Next, as shown in FIG. 20, a step similar to that described above referring to FIG. 11 is performed to deposit an insulating film IF3 and form a space SPA in the trench portion TP. Steps subsequent thereto are performed similar to those described referring to FIGS. 12 to 17 to form a semiconductor device of Comparative Example.

The insulating film IF2 formed in the step described referring to FIG. 19 is made of a PTEOS film. The PTEOS film is inferior in step coverage and the PTEOS film is inferior in flowability. In this case, the closer to the opening end of the opening portion OP, the greater the thickness of the insulating film IF2 formed on the side surface of the opening portion OP and the side surface of the trench portion TP.

In other words, the thickness of the insulating film IF2 formed on the side surface of the opening portion OP is greater than that of the insulating film IF2 formed on the upper portion of the side surface of the trench portion TP, while the thickness of the insulating film IF2 formed on the upper portion of the side surface of the trench portion TP is greater than that of the insulating film IF2 formed on the bottom portion of the side surface of the trench portion TP.

During formation of the insulating film IF2, a silicon oxide film configuring the insulating film IF2 is deposited much in a diagonally upward direction from the corner portion of the insulating film IF1 lying below the insulating film IF2. The corner portion of the insulating film IF1 is an end portion of the upper surface of the insulating film IF1 right above the opening portion OP. More specifically, the corner portion of the insulating film IF1 is a boundary portion between the upper surface of the insulating film IF1 on the insulating film HM and the side wall of the insulating film IF1 formed along the side wall of the opening portion OP. The maximum film thickness portion of the insulating film 152 deposited so as to close the trench portion TP therewith is formed in a diagonally upward direction toward a position right above the center of the opening portion OP with the corner portion as a base point in the step of depositing the insulating film IF2.

Then, when an insulating film IF3 is formed as shown in FIG. 20, the insulating films IF3 that cover the side walls of the opening portion OP opposite to each other are brought into contact with each other in the vicinity of a position where the insulating films 152 formed to be thick in the diagonally upward direction from the side walls of the opening portion OP opposite to each other, respectively, approach to each other. As a result, the trench portion TP is closed. The space SPA is therefore formed in the trench portion TP at a position where the insulating films IF3 are brought into contact with each other, that is, in the trench portion TP right below the closed position CPA.

It is difficult to lower the height of the closed position CPA of the space SPA by controlling the growth direction of the insulating film 152 so that the position of the closed position CPA of the space SPA may be higher than the desired position. In Comparative Example, the closed position CPA is located above the main surface of the semiconductor substrate SB and the upper surface of each of the element isolation regions EI. The position where the insulating films IF2 that cover the side walls of the opening portion OP opposite to each other approach most right above the trench portion TP is located above the main surface of the semiconductor substrate SB and the upper surface of each of the element isolation regions EI.

When the closed position CPA of the space SPA is higher than the desired position, for example, a polishing step described referring to FIG. 12 after formation of the insulating film IF2 makes the height position of the upper surface of the insulating film IF3 lower than the closed position CPA of the space SPA, leading to exposure of the space SPA from the surface of the insulating film IF3. In this case, there is a possibility of a polishing slurry entering the space SPA or a washing liquid entering the space SPA during the washing step performed after polishing. Then, the slurry or washing liquid that has entered the space SPA may blow out from the space SPA, leading to generation of foreign matters. As a result, the semiconductor device thus obtained may have defective shape and have deteriorated performance.

To prevent such deterioration, a reduction in the retreat amount of the upper surface of the insulating films including the insulating films IF2 and IF3 is necessary in the polishing and planarizing step in consideration of the high closed position CPA. In other words, the interlayer insulating films including the insulating films IF2 and IF3 should be thick in order to prevent exposure of the space SPA. In this case, due to an increase in the height position of the upper surface of the insulating film IF3 after planarization of the surface of the insulating film IF3, an aspect ratio, a depth:width ratio of the contact hole penetrating the insulating films IF2 and IF3 and reaching, for example, the source and drain region SD becomes excessively high.

In this case, variations in coupling resistance between the contact plug and the semiconductor element may occur due to difficulty in forming the contact hole and the contact plug with precision.

In addition, in the step of forming a contact hole, dry etching with a resist pattern made of a photoresist film as an etching mask requires long-hour etching because of the thick interlayer insulating film. In this case, the photoresist film in the vicinity of the opening portion of the resist pattern is etched much and the interlayer film right below the resist pattern exposed thereby is etched so that the contact hole with an irregular planar shape widens. The gate electrode GE1 and the like, which are not essentially exposed, are exposed right below the resulting contact hole, causing short-circuit between the source and drain regions SD and the gate electrode GE1. As a result, the semiconductor device does not operate normally.

In addition, in forming a contact hole with a high aspect ratio, it is difficult to open the contact hole until it reaches the main surface of the semiconductor substrate and to completely fill even the bottom portion of the contact hole with a metal film configuring a contact plug. In short, defective formation of the contact hole and contact plug may hinder the coupling between the contact plug and the MISFET Q1 or Q2 and thereby hinder the normal operation of the semiconductor device. As a result, the semiconductor device thus obtained has deteriorated performance.

In order to prevent such defective formation of the contact hole CH, it is necessary to change the design and increase the diameter of the contact hole CH and the contact plug PG and thereby decrease the aspect ratio of the contact hole CH and the contact plug PG. In this case, however, the area occupied by the contact plug PG increases, making it difficult to provide a downsized semiconductor device. The semiconductor device therefore has deteriorated performance inevitably.

In Comparative Example, the insulating film IF1 is formed to planarize the irregularities of the side wall of the trench portion TP, but covering the bottom surface of the trench portion TP with the insulating film IF1 increases the height of the bottom surface, among the surfaces exposed in the trench portion TP, immediately before the step of forming the insulating film IF2. After formation of the insulating film. IF1, the insulating films IF2 and IF3 are formed to form the space SPA, so that the position of the bottom portion of the space SPA increases. Thus, a decrease in the formation depth of the space SPA leads to deterioration in the insulation performance which will otherwise be achieved by forming the space SPA having an insulation property higher than that of the insulating film in the trench portion TP deeper than the isolation trench filled with the element isolation region EI. In short, the semiconductor device thus obtained has deteriorated performance.

As a measure for preventing a decrease in the formation depth of the space SPA, formation of a trench portion TP with a greater depth can be considered. In this case, however, the opening width of the trench portion TP should be widened in order to prevent an increase in aspect ratio of the trench portion TP. This increase the area occupied by the trench portion TP and the DTI structure, making it difficult to provide a miniaturized semiconductor chip. As a result, the semiconductor device has deteriorated performance.

<Main Characteristics and Advantages of Present Embodiment>

The height of the position at which the insulting films IF3 that respectively cover the side walls of the opening portion OP opposite to each other are brought into contact with each other and are thereby closed is determined by the height of the position at which the insulating films IF2 that respectively cover the side walls of the opening portion OP opposite to each other are closed or approach to each other. The insulating films IF2 that respectively cover the side walls of the opening portion OP opposite to each other deposit in a diagonally upward direction with the corner portion of the insulating film IF1 as a base point so that the height of the position, on the trench portion TP, at which the insulating films IF2 that respectively cover the side walls of the opening portion OP opposite to each other are closed or approach to each other is determined by the height of the corner portion of the insulating film IF1.

This means that the height of the top portion of the space SP in the trench portion TP, that is, the height of the closed position CP can be lowered by decreasing the height of the corner portion of the insulating film IF1 shown in FIG. 16.

In the present embodiment, after formation of the insulating film IF1 (refer to FIG. 8), the insulating film IF1 on the insulating film HM and a portion of the upper surface of the insulating film HM are removed by carrying out etchback as shown in FIG. 9. This allows the entirety of the upper surface of the insulating film IF1 to retreat to the side of the main surface of the semiconductor substrate SB so that the corner portion of the insulating film IF1 lowers. In addition, the insulating film IF1 is rounded at the corner portion thereof by the etch-back so that in the step of forming the insulating film IF2 (refer to FIG. 10), there occurs further lowering in the position of the corner portion of the insulating film IF1 serving as a base point from which the insulating films IF2 that approach to each other right above the trench portion TP are formed, that is, in the position where the insulating films IF1 respectively covering the side walls of the opening portion OP opposite to each other approach most to each other.

This means that there occurs lowering in the position of the base point of the film lying below the insulating films IF2 that cover the side wails of the opening portion OP opposite to each other and approach to each other in the vicinity of the closed position CP. More specifically, a lowering amount of the position of the base point is a total distance of the entire film thickness of the insulating film IF1 formed on the insulating film HM during the film formation step described referring to FIG. 8, the thickness of the insulating film HM removed in the etch-back step described referring to FIG. 9, and the lowering amount of the corner portion of the insulating film IF1 due to rounding of it in the etch-back step.

In the present embodiment, the entire film thickness of the insulating film IF1 removed by the etch-back step is 200 nm and the thickness of the insulating film HM removed by over-etching performed successively after removal of the insulating film IF1 in the etch-back step is, for example, 100 nm. The corner portion of the insulating film IF1 that covers the side wall of the opening portion OP is likely to be shaved by the etch-hack. The lowering amount of the position of the base point in the present embodiment is therefore 300 nm plus the distance of the corner portion lowered by shaving thereof.

By lowering the position of the base point, the position at which the insulating films IF2 that respectively cover the side walls of the opening portion OP opposite to each other approach to each other lowers in the film formation step described referring to FIG. 10. This leads to lowering of the position at which the trench portion TP is closed during subsequent formation of the insulating film IF3 (refer to FIG. 11), that is, lowering of the height of the closed position CP at the top of the space SP. As a result, in the subsequent polishing step described referring to FIG. 12, exposure of the space SP from the surface of the insulating film IF3 by polishing can be prevented.

In the present embodiment, since the height of the closed position CP is lowered, the closed position CP is located below the main surface of the semiconductor substrate SB and respective upper surfaces of the element isolation regions EI. The position at which the insulating films IF2 that respectively cover the side walls of the opening portion OP opposite to each other approach most to each other right above the trench portion TP is located below the main surface of the semiconductor substrate SB and the respective upper surfaces of the element isolation regions EI. The closed position CP is located above the bottom surface of the element isolation region EI.

Thus, by lowering the height of the closed position CP of the space SP and preventing exposure of the space SP from the surface of the insulating film IF3, it is possible to prevent a slurry for polishing or a washing liquid from entering the space SP and preventing the slurry or washing liquid that has entered the space SP from blowing out from the space SP to generate foreign matters. Therefore, the semiconductor device can be prevented from having a defective shape and have improved performance.

In addition, in order to prevent exposure of the space SPA, a reduction in the polishing amount in the polishing step described referring to FIG. 12 is not required. This means that excessive thickening of the interlayer insulating film including the insulating films IF2 and IF3 becomes unnecessary. The interlayer insulating film including the insulating films IF2 and IFS can have a reduced thickness.

This makes it possible to form the contact hole and contact plug with good precision and to prevent variation in coupling resistance between the contact plug and the semiconductor element.

Since the interlayer insulating film can have a reduced thickness, the resist pattern serving as an etching mask in the step of forming a contact hole as shown in FIG. 14 can be prevented from being etched excessively by dry etching for long hours. The contact hole CH having a desired opening shape can be formed with good precision so that abnormal widening of the contact hole CH in plan view can be prevented. This makes it possible to prevent short-circuiting in a semiconductor element or between semiconductor elements via the contact plug PG shown in FIG. 16.

In addition, since the interlayer insulating film can have a reduced thickness, even when the contact hole CH and the contact plug PG have a reduced diameter, it is possible to prevent the formation failure of the contact hole CH and the contact plug PG, which will otherwise occur due to an excessive increase in the aspect ratio of the contact hole CH and the contact plug PG. The contact hole CH and the contact plug PG with a small diameter enable miniaturization of a semiconductor chip. As a result, the semiconductor device can have improved performance.

In the present embodiment, after covering the bottom surface of the trench portion TP with the insulating film IF1 (refer to FIG. 8), the insulating film IF1 that covers the bottom surface of the trench portion TP is removed by the etch-back step described referring to FIG. 9 to expose the bottom surface of the trench portion TB. This makes it possible to prevent an increase in the height of the bottom surface, among the surfaces exposed the trench portion TP, due to formation of the insulating film IF1.

By removing the insulating film IF1 from the bottom portion of the trench portion TP, the depth of the bottom portion of the space SP when the insulating films IF2 and IF3 are formed after formation of the insulating film IF1 to form the space SP becomes lower than that of the above-described Comparative Example in which the insulating films IF2 and IF3 are formed while covering the bottom surface of the trench portion TP with the insulating film IF1. This increases the formation depth of the space SP and improves the insulation performance available by the formation of the space SP. In short, the semiconductor device thus obtained can have improved performance.

In addition, the trench portion TP is not required to have a further depth in order to prevent a decrease in the formation depth of the space SPA. In other words, widening of the opening width of the trench portion TP for preventing an increase in the aspect ratio of the trench portion TP, which will otherwise be caused by a further increase in the depth of the trench portion TP, is not necessary. An increase in the area occupied by the trench portion TP and the DTI structure DS can therefore be prevented. Without forming an excessively deep trench portion TP, sufficient insulation performance can be achieved by the formation of the DTI structure so that improvement in element isolation properties and miniaturization of a semiconductor chip can be achieved simultaneously. The semiconductor device thus obtained can therefore have improved performance.

The invention made by the present inventors has been described specifically based on Embodiment. The invention is however not limited to or by the embodiment. It is needless to say that the invention can be changed in various ways without departing from the gist of the invention.

What is claimed is:

1. A method of manufacturing a semiconductor device, comprising the steps of:
   (a) providing a semiconductor substrate;
   (b) forming a first insulating film over a main surface of the semiconductor substrate;
   (c) processing the first insulating film to form an opening portion penetrating the first insulating film;
   (d) forming a trench portion in a portion of the main surface of the semiconductor substrate right below the opening portion and such that, along a length of the trench portion, the trench portion is wider than the opening portion;
   (e) after the step (d), forming a second insulating film that covers a side wall and a bottom surface of the trench portion and an upper surface of the first insulating film;
   (f) carrying out etch-back of an upper surface of the second insulating film to expose the upper surface of the first insulating film;
   (g) after the step (f), forming a third insulating film that covers the upper surface of the first insulating film and a side wall of the second insulating film in the trench portion; and
   (h) forming a fourth insulating film that covers an upper surface of the third insulating film to form a space in the trench portion.

2. The method of manufacturing a semiconductor device according to claim 1,
   wherein the upper surface of the first insulating film and the lower surface of the third insulating film are contiguous to each other.

3. The method of manufacturing a semiconductor device according to claim 1,
   wherein a ratio of a thickness of the second insulating film over the first insulating film to a thickness of the second insulating film along the side wall of the trench portion after the step (e) but before the step (f) is smaller than a ratio of the third insulating film over the first insulating film to a thickness of the third insulating film along the side wall of the trench portion after the step (g).

4. The method of manufacturing a semiconductor device according to claim 1,
   wherein in the step (f), the upper surface of the second insulating film and the upper surface of the first insulating film are caused to retreat by the etch-back.

5. The method of manufacturing a semiconductor device according to claim 4, further comprising a step of:
   (a1) after the step (a) but before the step (b), forming a fifth insulating film over the semiconductor substrate, and
   wherein after the step (f), the fifth insulating film has an upper surface covered with the first insulating film.

6. The method of manufacturing a semiconductor device according to claim 1, further comprising a step of:

(a2) after the step (a) but before the step (b), forming a semiconductor element over the semiconductor substrate,
wherein in the step (b), the first insulating film covers the semiconductor element,
wherein in the step (e), the second insulating film covers the semiconductor element, and
wherein in the step (f), by the etch back of the upper surface of the second insulating film, the semiconductor element is exposed from the second insulating film.

7. The method of manufacturing a semiconductor device according to claim 6, further comprising the steps of:
   (i) polishing an upper surface of the fourth insulating film;
   (j) after the step (i), forming a coupling hole penetrating the fourth insulating film, the third insulating film, and the first insulating film; and
   (k) forming, in the coupling hole, a coupling portion electrically coupled to the semiconductor element,
   wherein the space is covered with the fourth insulating film.

8. The method of manufacturing a semiconductor device according to claim 1,
   wherein in the step (f), the etch-back of the upper surface of the second insulating film is performed to expose a bottom surface of the trench portion.

9. The method of manufacturing a semiconductor device according to claim 1, further comprising a step of:
   (a3) after the step (a) but before the step (b), forming an isolation trench in the main surface of the semiconductor substrate to form an element isolation region in the isolation trench,
   wherein in the step (c), the opening portion is formed which penetrates the element isolation region and the first insulating film.

10. The method of manufacturing the semiconductor device according to claim 1, wherein in (e), a film thickness of the second insulating film is scalloped in a direction away from the opening portion.

11. The method of manufacturing the semiconductor device according to claim 1, wherein in (g), a film thickness of the third insulating film decreases in a direction away from the opening portion.

12. A method of manufacturing a semiconductor device, comprising the steps of:
   (a) providing a semiconductor substrate;
   (b) forming a first insulating film over a main surface of the semiconductor substrate;
   (c) processing the first insulating film to form an opening portion penetrating the first insulating film;
   (d) forming a trench portion in a portion of the main surface of the semiconductor substrate right below the opening portion;
   (e) after the step (d), forming a second insulating film that covers a side wall and a bottom surface of the trench portion and an upper surface of the first insulating film;
   (f) carrying out etch-back of an upper surface of the second insulating film to expose the upper surface of the first insulating film;
   (g) after the step (f), forming a third insulating film that covers the upper surface of the first insulating film and a side wall of the second insulating film in the trench portion; and
   (h) forming a fourth insulating film that covers an upper surface of the third insulating film to form a space in the trench portion,
   wherein a ratio of a thickness of the second insulating film over the first insulating film to a thickness of the second insulating film along the side wall of the trench portion after the step (e) but before the step (f) is smaller than a ratio of the third insulating film over the first insulating film to a thickness of the third insulating film along the side wall of the trench portion after the step (g).

13. A method of manufacturing a semiconductor device, comprising the steps of:
   (a) providing a semiconductor substrate;
   (b) forming a first insulating film over a main surface of the semiconductor substrate;
   (c) processing the first insulating film to form an opening portion penetrating the first insulating film;
   (d) forming a trench portion in a portion of the main surface of the semiconductor substrate right below the opening portion;
   (e) after the step (d), forming a second insulating film that covers a side wall and a bottom surface of the trench portion and an upper surface of the first insulating film;
   (f) carrying out etch-back of an upper surface of the second insulating film to expose the upper surface of the first insulating film;
   (g) after the step (f), forming a third insulating film that covers the upper surface of the first insulating film and a side wall of the second insulating film in the trench portion; and
   (h) forming a fourth insulating film that covers an upper surface of the third insulating film to form a space in the trench portion,
   wherein in the step (f), the etch-back of the upper surface of the second insulating film is performed to expose a bottom surface of the trench portion.

14. A method of manufacturing a semiconductor device, comprising the steps of:
   (a) providing a semiconductor substrate;
   (b) forming a first insulating film over a main surface of the semiconductor substrate;
   (c) processing the first insulating film to form an opening portion penetrating the first insulating film;
   (d) forming a trench portion in a portion of the main surface of the semiconductor substrate right below the opening portion;
   (e) after the step (d), forming a second insulating film that covers a side wall and a bottom surface of the trench portion and an upper surface of the first insulating film;
   (f) carrying out etch-back of an upper surface of the second insulating film to expose the upper surface of the first insulating film;
   (g) after the step (f), forming a third insulating film that covers the upper surface of the first insulating film and a side wall of the second insulating film in the trench portion;
   (h) forming a fourth insulating film that covers an upper surface of the third insulating film to form a space in the trench portion; and
   (a3) after the step (a) but before the step (b), forming an isolation trench in the main surface of the semiconductor substrate to form an element isolation region in the isolation trench,
   wherein in the step (c), the opening portion is formed which penetrates the element isolation region and the first insulating film.

* * * * *